United States Patent
Domercq et al.

(10) Patent No.: US 9,222,641 B2
(45) Date of Patent: Dec. 29, 2015

(54) TRANSLUCENT CONDUCTIVE SUBSTRATE FOR ORGANIC LIGHT EMITTING DEVICES

(75) Inventors: Benoit Domercq, Braine-l'Alleud (BE); Philippe Roquiny, Yokohama (JP); Daniel Decroupet, Fosses-La-Ville (BE); Nobuhiro Nakamura, Yokohama (JP); Naoya Wada, Yokohama (JP); Nao Ishibashi, Yokohama (JP)

(73) Assignees: AGC Glass Europe, Louvain-la-Neuve (BE); Asahi Glass Company, Limited, Tokyo (JP)

( * ) Notice: Subject to any disclaimer, the term of this patent is extended or adjusted under 35 U.S.C. 154(b) by 319 days.

(21) Appl. No.: 13/810,545

(22) PCT Filed: Jul. 15, 2011

(86) PCT No.: PCT/EP2011/062132
§ 371 (c)(1),
(2), (4) Date: Jan. 16, 2013

(87) PCT Pub. No.: WO2012/007575
PCT Pub. Date: Jan. 19, 2012

(65) Prior Publication Data
US 2013/0114269 A1    May 9, 2013

(30) Foreign Application Priority Data
Jul. 16, 2010 (WO) .................. PCT/EP2010/060304

(51) Int. Cl.
*H01J 1/62*    (2006.01)
*H01J 63/04*    (2006.01)
(Continued)

(52) U.S. Cl.
CPC .............. *F21V 5/002* (2013.01); *G02B 5/0242* (2013.01); *G02B 5/0247* (2013.01); *H01L 51/5215* (2013.01); *H01L 51/5268* (2013.01)

(58) Field of Classification Search
CPC . H01L 51/5268; H01L 51/0096; H01L 51/56; H01L 25/048; H01L 27/3209; H01L 51/5237; H05B 33/10; H05B 33/02
USPC .................. 313/498–512; 445/23–25, 58
See application file for complete search history.

(56) References Cited

U.S. PATENT DOCUMENTS 6,040,056 A    3/2000  Anzaki et al.
8,339,031 B2   12/2012  Tchakarov et al.
(Continued)

FOREIGN PATENT DOCUMENTS

EP     1 329 307       7/2003
JP     11-284343 A    10/1999
(Continued)

OTHER PUBLICATIONS

Pang, H., et al., "ZnS/Ag/ZnS coating as transparent anode for organic light emitting diodes," Journal of Luminescence, vol. 122-123, pp. 587 to 589, (2007) XP-5768020.
(Continued)

*Primary Examiner* — Thomas A Hollweg
*Assistant Examiner* — Kevin Quarterman
(74) *Attorney, Agent, or Firm* — Oblon, McClelland, Maier & Neustadt, L.L.P.

(57) ABSTRACT

A translucent conductive substrate (1) for Organic Light Emitting Device comprising, a transparent support (10), a scattering layer (11) formed over the transparent support (10) and comprising a glass which contains a base material (110) having a first refractive index for at least one wavelength of light to be transmitted and a plurality of scattering materials (111) dispersed in the base material (110) and having a second refractive index different from that of the base material and a transparent electrode (12) formed over the scattering layer (11), said electrode (12) comprising at least one metal conduction layer (122) and at least one coating (120) having properties for improving the light transmission through said electrode, said coating (120) comprises at least one layer for improving light transmission (1201) and is located between the metal conduction layer (122) and the scattering layer (11), on which said electrode (12) is deposited.

19 Claims, 11 Drawing Sheets

(51) Int. Cl.
*F21V 5/00* (2015.01)
*H01L 51/52* (2006.01)
*G02B 5/02* (2006.01)

(56) References Cited

U.S. PATENT DOCUMENTS

| | | |
|---|---|---|
| 8,400,054 B2 | 3/2013 | Dobbertin et al. |
| 2003/0186064 A1 | 10/2003 | Murata et al. |
| 2005/0140278 A1* | 6/2005 | Kato .............................. 313/504 |
| 2009/0153972 A1 | 6/2009 | Nakamura et al. |
| 2010/0187987 A1* | 7/2010 | Nakamura .................... 313/504 |
| 2010/0225227 A1 | 9/2010 | Tchakarov et al. |
| 2010/0230667 A1* | 9/2010 | Nakamura et al. .............. 257/40 |
| 2011/0278635 A1* | 11/2011 | Nakamura et al. .............. 257/99 |
| 2012/0194065 A1* | 8/2012 | Aoki et al. .................... 313/504 |

FOREIGN PATENT DOCUMENTS

| | | | |
|---|---|---|---|
| JP | 2008-270812 A | 11/2008 | |
| JP | 2010-503166 A | 1/2010 | |
| JP | 2010-147243 A | 7/2010 | |
| WO | 2008 059185 | 5/2008 | |
| WO | WO 2009/017035 A1 | 2/2009 | |
| WO | WO 2009116531 A1 * | 9/2009 | ............. H01L 51/52 |

OTHER PUBLICATIONS

International Search Report Issued Sep. 19, 2011 in PCT/EP11/62132 Filed Jul. 15, 2011.

Office Action issued Mar. 17, 2015 in Japanese Patent Application No. 2013-520077 (submitting English language translation only).

* cited by examiner

TRANSLUCENT CONDUCTIVE SUBSTRATE FOR ORGANIC LIGHT EMITTING DEVICES

1. FIELD OF THE INVENTION

The present invention relates to a translucent conductive substrate for Organic Light Emitting Devices (OLEDs), to the method for producing said translucent conductive substrate, to an Organic Light Emitting Diode incorporating said translucent conductive substrate and to the method for producing said Organic Light Emitting Device.

2. BACKGROUND ART

An Organic Light Emitting Device (OLED) comprises at least an organic layer which is put between electrodes, a voltage is applied between the electrodes to inject holes and electrons, which are allowed to recombine in the organic layer, thereby an light is emitted by a light-emitting molecule in the course of a transition from an excited state to a lower energy state. The Organic Light Emitting Device is used for lighting display, backlight and lighting applications.

Starting from the support, OLEDs are divided into three categories, bottom-emitting, top-emitting and transparent OLEDs. The bottom-emitting OLED uses a transparent or semi-transparent bottom electrode, the light is emitted through a transparent support. A top-emitting OLED uses a transparent or semi-transparent top electrode through said light is emitted, in other words the light is not emitted through the support. Finally, transparent OLED (T-OLED) uses transparent or semi-transparent electrodes on both sides of the device in such a way that the light can be emitted both through the top and the bottom electrode. As used herein, the expression "bottom electrode" is understood to denote the electrode which is the closest to the support.

In general, a bottom emitting OLED comprises at least one transparent electrode generally made from indium-doped tin oxide (ITO), a transparent support for supporting the transparent electrode and a reflective counter electrode which is generally made from calcium, silver or aluminium. The transparent support is made, for example, of glass, ceramic glass or polymer film. The refractive indexes of the different constituents of the OLED are in the range of 1.6-1.8 for the organic layers of the light-emitting device, 1.6 to 2.0 for the ITO layer, 1.4 to 1.6 for the supporting substrate and 1.0 for the outside air.

Organic light-emitting devices are manufactured with a good internal light efficiency. This efficiency is expressed in terms of internal quantum efficiency (IQE). Internal quantum efficiency represents the ratio between the number of photons obtained divided by the number of electrons injected. It lies in the order of 85%, even close to 100%, in known organic light-emitting devices. However, the efficiency of these devices is clearly limited by the losses associated with interface reflection phenomena due to the differences between the refractive indexes of the materials constituting the layers defining the interfaces. The losses as a result of reflection (R) occur at the interfaces and cause a reduction in external quantum efficiency (EQE). The external quantum efficiency is equal to the internal quantum efficiency minus the losses through reflection. As a result of all these combined losses, it is commonly accepted that the external quantum efficiency is generally in the range of 20% to 25% of the internal quantum efficiency.

Indium-doped tin oxide (ITO) is the material most widely used to form transparent electrodes. However, its use unfortunately causes some problems. Indeed indium resources are limited, which in the short term will lead to an inevitable increase in production costs for these devices. Moreover, because of the limited resistivity of ITO, it is essential to use a thick layer to obtain a sufficiently conductive electrode (i.e., an ITO layer having a resistance of around 5Ω/□ requires a thickness such that the absorption of the electrode is increased). Moreover, thick ITO is generally more crystalline, causing an increase in the microscopic roughness of the surface, which must then be polished occasionally for use within organic light-emitting devices. For display applications, such ITO material may have sufficient conductivity because the pixels size is small, typically on the order of 1 mm or less. However, the conductivity of such transparent ITO electrodes can be insufficient for applications that require much larger emitting area such as lighting panel. Furthermore, indium present in organic light-emitting devices has a tendency to diffuse into the organic part of these devices resulting in a reduction in the shelf and operating lifetime of these devices.

To solve these problems, different electrode structures have been proposed. Document WO 2008/029060 A2 discloses a transparent substrate, in particular a transparent glass substrate, having a multilayer electrode with a complex stacking structure comprising a metal conductive layer and also having a base layer combining the properties of a barrier layer and an antireflective layer. This type of electrode enables layers with a low resistivity and a transparency at least equal to the electrode of ITO to be obtained, and these electrodes can be advantageously used in the field of large-surface light sources such as light panels. Moreover, these electrodes allow the quantity of indium used in their fabrication to be reduced or even suppressed entirely. However, although an antireflective layer in the form of a barrier layer is used, the solutions proposed in document WO 2008/029060 A2 do not seek in any way to optimize the amount of light emitted by an OLED limiting the losses associated with interface reflection phenomena. Furthermore, a colour variation of the light emitted by the OLED depending on the viewing angle is also observed.

3. PROBLEMS TO BE SOLVED

It is an aim of the invention to overcome the disadvantages of the prior art.

More precisely, an aim set by the present invention, in at least one embodiment, is to provide a translucent conductive substrate for OLED that allows an increase in the amount of light transmitted in the forward direction through the substrate to be obtained, in other words an increase in the amount of light emitted by an OLED that it is incorporated into, i.e. in the case of a monochromic radiation. The term "monochromic" is understood to mean that a single colour (e.g. red, green, blue, white . . . ) is perceived by the eye without this light being monochromatic as such. In other words, monochromic radiation denotes a radiation covering a wavelength range and not a simple wavelength. Furthermore, the said translucent conductive substrate must be easy to manufacture.

An aim set of the present invention, in at least one embodiment, is to provide a translucent conductive substrate for OLED that allows to decrease, even to suppress, the amount of materials based on Indium, Indium oxide or a mixture thereof used to fabricate the transparent electrode which is comprised in the translucent conductive substrate.

Another aim set of the present invention, in at least one embodiment, is to provide a translucent conductive substrate that allows a decrease of the colour angular dependency of the light emitted by an OLED incorporating said translucent conductive substrate.

4. INVENTION DISCLOSURE

The present invention is directed to a translucent conductive substrate for Organic Light Emitting Device comprising:
- a transparent support,
- a scattering layer formed over the transparent support and comprising a glass which contains a base material having a first refractive index for at least one wavelength of light to be transmitted and a plurality of scattering materials dispersed in the base material and having a second refractive index different from that of the base material,
- a transparent electrode formed over the scattering layer, said electrode comprising at least one metal conduction layer, preferably a single metal conduction layer, and at least one coating having properties for improving the light transmission through said electrode, wherein said coating has a geometric thickness at least more than 3.0 nm and at most less than or equal to 200 nm, The advantage provided by the substrate according to the invention is that it allows from one hand, an increase in the amount of light emitted by a OLED in the forward direction that incorporates it, i.e. in the case of monochromic radiation, and on the other hand, a decrease of the colour variation of the light emitted by the OLED depending on the viewing angle. Moreover, in the case of an organic light-emitting device emitting white light, the substrate according to the invention can be used with any known type of layered stacking structure forming the organic part of the OLED that emits white light.

The translucent conductive substrate of the present invention comprises a transparent support. The support will be considered to be transparent when it exhibits a light absorption of at most 50%, even at most 30%, preferably at most 20%, more preferred at most 10% at wavelengths in the visible light range. In a particular embodiment the translucent conductive substrate according to the invention comprises a transparent support having a refractive index at least equal to 1.2, preferably at least equal to 1.4, more preferred at least equal to 1.5 at a wavelength of 550 nm. The advantage provided by using a support with a high refractive index is that it allows the amount of transmitted or emitted light in the forward direction to be increased with the same translucent conductive substrate structure.

The term "support" is also understood to mean not only the support as such, but also any structure comprising the support as well as at least one layer of a material with a refractive index, $n_{material}$, close to the refractive index of the support, $n_{support}$, in other words $|n_{support} - n_{material}| \leq 0.1$. $|n_{support} - n_{material}|$ represents the absolute value of the difference between the refractive indexes. A silicon oxide layer deposited on a soda-lime-silica glass support can be cited as example. This layer is used to protect the glass surface against aging before other layer would be deposited.

The function of the support is to support and/or protect the electrode. The support can be made of glass, rigid plastic material (e.g. organic glass, polycarbonate) or flexible polymer films (e.g. polyvinyl chloride (PVC), polyethylene terephthalate (PET), polypropylene (PP), polytetrafluoroethylene (PTFE)). The support is preferably rigid.

If the support is a polymer film, this preferably has a high refractive index, wherein the refractive index of the support ($n_{support}$) has a value at least equal to 1.4, preferably at least equal to 1.5, more preferred at least equal to 1.6. $n_{support}$ represents the refractive index of the support at a wavelength of 550 nm. The advantage provided by using a support with a high refractive index is that it allows the amount of emitted light to be increased with the same substrate structure.

If the support is made of glass, e.g. a sheet of glass, this preferably has a geometric thickness of at least 0.1 mm. The term "geometric thickness" is understood to mean the average geometric thickness. Glasses are mineral or organic. Mineral glasses are preferred. Of these, soda-lime-silica glasses that are clear or are bulk or surface coloured are preferred. More preferred, these are extra-clear soda-lime-silica glasses. The term extra-clear denotes a glass containing at most 0.020% by weight of the glass of total Fe expressed as $Fe_2O_3$ and preferably more than 0.015% by weight. Because of its low porosity, the glass has the advantage of assuring the best protection against any form of contamination of an OLED comprising the translucent conductive substrate according to the invention. A glass having a high refractive index is preferred, the refractive index of the glass has a value at least equal to 1.4, preferably at least equal to 1.5, more preferred at least equal to 1.6, most preferred at least equal to 1.7. Nevertheless, for reasons of cost, the refractive index of the glass, $n_{support}$, preferably has a value in the range of between 1.4 and 1.6. More preferred, the refractive index of the glass has a value of about 1.5. $n_{support}$ represents the refractive index of the support at a wavelength of 550 nm. Advantageously, the glass support comprises at least one barrier layer on the face of the glass on which the scattering layer is deposited. This layer in particular allows the electrode to be protected from any contamination by the migration of alkaline substances coming from the support, e.g. made of soda-lime-silica glass, and thus enables the service life of the electrode to be extended. The barrier layer comprises at least one compound selected from the following: silicon oxide, aluminium oxide, titanium oxide, mixed oxide of zinc-tin, mixed oxide of zinc-aluminium, silicon nitride, aluminium nitride, titanium nitride, silicon oxynitride, aluminium oxynitride.

The substrate of the present invention comprises a scattering layer, wherein said scattering layer is formed over the transparent support and comprises a glass which contains a base material having a first refractive index for at least one wavelength of light to be transmitted and a plurality of scattering materials dispersed in the base material and having a second refractive index different from that of the base material.

The scattering layer is formed by depositing a glass powder on the glass substrate by a method such as coating and firing it at a desired temperature. The said scattering layer has the base material having a first refractive index and a plurality of scattering materials dispersed in the above-mentioned base material and having a second refractive index different from that of the above-mentioned base material. As the scattering layer, a material (base material) having a main surface coated and having a high light transmittance may be used. As the base material, a glass, a crystallized glass, a translucent resin or a translucent ceramic may be used. As a material for the glass, an inorganic glass such as soda lime glass, borosilicate glass, non-alkali glass, low-alkali glass or quartz glass may be used. Incidentally, the plurality of scattering materials is formed in the inside of the base material. In an embodiment, the translucent conductive substrate is so that the scattering materials are selected from pores, precipitated crystals, material particles having a different chemical composition than base material, phase-separated glass or mixtures from at least two thereof. The scattering materials are preferably selected from precipitated crystals, material particles having a different chemical composition than base material, phase-separated glass or mixtures from at least two thereof. The scattering materials are most preferably selected from phase-separated glass. The material particle as used herein as scattering material means a small solid material. In an embodiment, the translucent conductive substrate is so that the material particles used as scattering materials are selected from crystalline particles, amorphous particles or at least a mixture thereof. The material particles used as scattering materials may have the same or different chemical compositions, preferably the particles have the same chemical composition. The material constituting the particle is preferably selected from a ceramic material. The ceramic is selected from a ceramic oxide ($TiO_2$, $ZrO_2$, $SnO_2$, $ZnO_2$, $SiO_2$, $Sb_2O_3$, $Al_2O_3$, $ZrSiO_4$, preferably $TiO_2$, $ZrO_2$, $Al_2O_3$, $SiO_2$), a ceramic non-oxide (carbides, borides, nitrides, silicides) or a composite ceramic (combinations of oxides and non-oxides ceramics). The particles are in the form of fillers (i.e., colloidal particles, aggregates, clusters, . . . ). In case of using the particles as the scattering materials, it is desirable to make the scattering layer by two layers. In this case, it is desirable that the particle doesn't exist in the scattering layer in the upper layer. Furthermore, the pore means an air or gas material trapped within the base material. Furthermore, the phase-separated glass means a glass composed of two or more kinds of glass phases. Incidentally, when the scattering material is the pore, the size of the scattering material indicates a diameter of a void.

In an embodiment, the translucent conductive substrate according to the invention, is so that the distribution of the scattering materials in the scattering layer decreases from the inside of the scattering layer towards the face of the scattering layer opposite to the transparent support on which said scattering layer is deposited. Furthermore, in order to prevent inter-electrode short circuit of the OLED element, the main surface of the scattering layer is required to be smooth. For that purpose, it is unfavourable that the scattering materials protrude from the main surface of the scattering layer. Also in order to prevent the scattering materials from protruding from the main surface of the scattering layer, it is preferred that the scattering materials are not present within 1.0 μm, preferably 0.5 μm, most preferably 0.2 μm from the main surface of the scattering layer, in other words the face of the scattering layer opposite to the transparent support on which said scattering layer is deposited.

In an embodiment, the scattering layer is not limited to a single layer but may be two or more layers. In case that the scattering layer comprises a first layer part and a second layer part formed on the first layer part, it is preferable that the said second layer part is thinner than the first layer part and the first layer part has the scattering materials much more than the second layer part. In particular, if the solid materials are used as the scattering materials, it is more preferable that the second layer part does not have the scattering materials except for an interface between the first and second layer parts. Due to the existence of the solid materials on the surface of the scattering layer has the possibility of causing the short circuit.

The surface of the scattering layer has curvature surface with swell. Thereby, the swell means cycle R·a is at least 10 μm. The size of swell (roughness) means Ra is within the range from 0.01 μm to 5 μm. It is preferable that R·a is more than 10 μm and Ra/R·a is within a range from $1.0*10^{-5}$ to $1.0*10^{-1}$, causing mirror function of an anode electrode to reduce. It is more preferable that R·a is more than 50 μm and Ra/R·a is within a range from $1.0*10^{-4}$ to $3.0*10^{-2}$. The Ra and the R·a used herein mean values calculated based on ISO 4287:1997 (JIS B0601:2001), taking the short wavelength cutoff value as 25 μm and the long wavelength cutoff value as 2.5 mm.

Although both the refractive indexes of the scattering material and the base material may be high, the absolute value of the difference in the refractive indexes, $|\Delta n|$, is preferably 0.2 or more, $|\Delta n| \geq 0.2$, for at least one portion in the emission spectrum range of the scattering layer. In order to obtain sufficient scattering characteristics, the absolute value difference in the refractive indexes, $|\Delta n|$, is more preferably 0.2 or more, $|\Delta n| \geq 0.2$, over the whole region (430 nm to 650 nm) of the emission spectrum range or the whole region (360 nm to 830 nm) of the wavelength range of visible light. The geometrical thickness of the scattering layer is in the range of 2 μm to 100 μm, preferably in the range of 10 μm to 60 μm.

Normally, the refractive index of the scattering layer must be equivalent to or higher than the refractive index of the transparent electrode material based on a transparent conductive oxide such as ITO. When the refractive index is low, a loss due to total reflection occurs at an interface between the base material and the translucent electrode material. The refractive index of the base material is only required to exceed for at least one portion (for example, red, blue, green or the like) in the emission spectrum range of the scattering layer. However, it exceeds preferably over the whole region (430 nm to 650 nm) of the emission spectrum range, and more preferably over the whole region (360 nm to 830 nm) of the wavelength range of visible light. The inventors have surprisingly found that this condition is not required with an electrode having a multilayered structure. The refractive index of the scattering layer is determined as follow, a glass having the same composition as the scattering layer is prepared and the refractive index of said glass is measured using a Shimadzu Device Corporation measurement apparatus brand name KPR2000 using a prism method.

In order to obtain the maximum refractive index difference, a scattering layer using a high refractive index glass as the above-mentioned high light transmittance material and the gas material, namely the pores, as the scattering material is desirable. In this case, the refractive index of the base material is desirably as high as possible, so that the high refractive index glass is preferably used as the base material. For components of the high refractive index glass, one or two or more kinds of components selected from $P_2O_5$, $SiO_2$, $B_2O_3$, $Ge_2O$ and $TeO_2$ can be used, as network formers, and one or two or more kinds of components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as high refractive index components. In addition, in a sense of adjusting characteristics of the glass, an alkali oxide, an alkaline earth oxide, a fluoride or the like may be used within the range not impairing characteristics required for the refractive index. Specific glass systems include a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, a $P_2O_5$—$ZnO$ system and the like, wherein R' represents an alkali metal element, and R" represents an alkaline earth metal element. Incidentally, the above are examples, and the glass system is not construed as being limited to these examples as long as it is constituted so as to satisfy the above-mentioned conditions.

In the invention, the scattering layer uses a glass containing 15 to 30 mol % of $P_2O_5$, 5 to 25 mol % of $Bi_2O_3$, 5 to 27 mol % of $Nb_2O_5$, 10 to 35 mol % of ZnO and 5 mass % or less of the alkali metal comprising $Li_2O$, $Na_2O$ and $K_2O$ in terms of total amount thereof.

$P_2O_5$ is an essential component because it is a network former which is a skeleton of this glass system, and is a glass stabilizing element. However, when the content is too low, devitrification of the glass increases to result in failure to obtain the glass. Accordingly, it is preferably 15 mol % or more, and more preferably 18 mol % or more. On the other hand, when the content is too high, the refractive index decreases to result in failure to achieve the object of the invention. Accordingly, it is preferably 30 mol % or less, and more preferably 28 mol % or less. Therefore, the amount of $P_2O_5$ in the glass is advantageously comprised within the range of two of the preceding values, more advantageously within the range from 18 mol % to 28 mol %.

$Bi_2O_3$ is a component improving the refractive index, and can be introduced into the glass in relatively high amounts while keeping stability of the glass. Accordingly, the content is more than 5 mol %, preferably more than 10 mol %, and more preferably more than 13 mol %. However, excessive introduction thereof poses the problem of fabricating a rather coloured glass decreasing therefore the transmittance. Accordingly, the content is 25 mol % or less, preferably 23 mol % or less, and more preferably 20 mol % or less. Therefore, the amount of $Bi_2O_3$ in the glass is advantageously comprised within the range of two of the preceding values, preferably comprised within the range from 10 mol % to 23 mol %, more preferably from 13 mol % to 20 mol %.

$Nb_2O_5$ is an essential component improving the refractive index and also having an effect of enhancing weather resistance at the same time. Accordingly, the content is 5 mol % or more, preferably 7 mol % or more, and more preferably 10 mol % or more. On the other hand, when the content is too high, devitrification increases resulting in failure to obtain a glass. Accordingly, the content thereof is 27 mol % or less, preferably 20 mol % or less, and more preferably 18 mol % or less. Therefore, the amount of $Nb_2O_5$ in the glass is advantageously comprised within the range of two of the preceding values, preferably within the range from 7 mol % to 20 mol %, more preferably within the range from 10 mol % to 18 mol %.

ZnO is a component improving the refractive index and decreasing the glass transition temperature. Accordingly, the content is 10 mol % or more, preferably 16 mol % or more, more preferably 18 mol % or more. However, when it is excessively added, devitrification of the glass increases resulting in failure to obtain a homogeneous glass. Accordingly, the content is 35 mol % or less, preferably 30 mol % or less, and more preferably 27 mol % or less. Therefore, the amount of ZnO in the glass is advantageously comprised within the range of two of the preceding values, preferably within the range from 16 mol % to 30 mol %, more preferably from 18 mol % to 27 mol %.

The alkali metal oxides ($R_2O$) such as $Li_2O$, $Na_2O$ and $K_2O$ has an effect of improving meltability to decrease the glass transition temperature and concurrently an effect of enhancing affinity with the glass substrate to increase adhesion. For this reason, it is desirable for the mixture to contain one or two or more kinds of these said alkali metal oxides. When they are in excessive proportions, stability of the glass is impaired. In addition, these components tend to decrease the refractive index resulting in failure to the desired improvement of the light-extraction efficiency. Furthermore, a use of a low amount of alkali decreases the contamination risk of the electrode or the organic part of the OLED by these alkaline ions. Therefore, the total amount of alkali metal oxide is preferably less than 5% by mass, more preferably less than 2% by mass, particularly preferably not contain substantially.

$TiO_2$ is an optional component improving the refractive index. However, when the content is too high, colouring of the glass increases to cause an increased loss in the scattering layer, resulting in failure to achieve the object of improving the light-extraction efficiency. Accordingly, the content is preferably up to 8 mol %.

$B_2O_3$ is an optional component as a component which is added into the glass, thereby improving resistance to devitrification and decreasing the thermal expansion coefficient. When the content is too high, the refractive index decreases. It is therefore preferably 17 mol % or less.

$WO_3$ is an optional component improving the refractive index and decreasing the glass transition temperature to decrease the firing temperature. However, excessive introduction thereof results in colouring of the glass to cause a decrease in the light-extraction efficiency. Accordingly, the content thereof is preferably up to 20 mol %.

$TeO_2$ is an optional component having the effect of lowering the glass transition temperature while suppressing the excessive rise of thermal expansion. Accordingly, the content is preferably up to 7 mol %.

$GeO_2$ is an optional component having the effect of a high refractive index. Accordingly, the content is preferably up to 7 mol %.

$Sb_2O_3$ is an optional component having the effect of suppressing the colour. Accordingly, the content is preferably up to 2 mol %.

Alkaline Earth Metal Oxides (MgO, CaO, SrO and BaO) are optional components improving the stability of the glass. However, excessive introduction thereof results in reducing the thermal expansion coefficient and refractive index. Accordingly, the total content thereof is preferably up to 10 mol %.

Even if a component other than the above-mentioned components, we may add for the purposes of refining or an improvement of solubility, as long as it does not deviate from the efficiency of the present invention. Such components include, for example $SiO_2$, $Al_2O_3$, $La_2O_3$, $Y_2O_3$, $Gd_2O_3$, $ZrO_2$, $Ta_2O_3$, $Cs_2O$ and may also contain transition metal oxides. Their content is preferably less than 5 mol % in the total, more preferably less than 3 mol %, particularly preferably not contain substantially.

The glass of the present invention substantially does not contain lead oxide, less likely to cause environmental pollution.

The substrate of the present invention comprises a transparent electrode, wherein said electrode can act as an anode or conversely as a cathode, depending on the type of OLED in which said electrode is inserted into. The expression "a coating having properties for improving light transmission" is understood to denote a coating whose presence in the stacking structure forming the electrode leads to an increase in the amount of light transmitted through the substrate, e.g. a coating having antireflective properties. In other words, an OLED incorporating the substrate according to the invention emits a higher amount of light compared to an OLED of the same type, but having a classic electrode (e.g.: an ITO layer) deposited on an identical support to that of the substrate according to the invention, the increase in the amount of light emitted is characterized by a higher luminance value, irrespective of the colour of the emitted light.

The geometric thickness of the coating for improving light transmission must have a thickness at least greater than 3.0 nm, preferably at least equal to 5.0 nm, more preferred at least equal to 7.0 nm, most preferred at least equal to 10.0 nm. For example, when the coating for improving light transmission is based on zinc oxide or on zinc oxide under-stoichiometric in oxygen, $ZnO_x$, wherein these zinc oxides are possibly doped or alloyed with tin, a geometric thickness of the coating for improving light transmission of at least more than 3.0 nm allows a metal conduction layer, particularly of silver, that has a good electrical conductivity to be obtained. The geometric thickness of the coating for improving light transmission advantageously has a thickness of less than or equal to 200.0 nm, preferably less than or equal to 170.0 nm, more preferred less than or equal to 130.0 nm, and the advantage of such thicknesses lies in the fact that the production process of said coating is quicker. Therefore, the geometric thickness of the coating for improving light transmission is advantageously comprised within the range from 5.0 nm to 200.0 nm, preferably from 7.0 nm to 170.0 nm, more preferred from 10.0 nm to 130 nm.

The geometric thickness of the metal conduction layer is at least equal to 6.0 nm, preferably at least equal to 8.0 nm, more preferred at least equal to 10.0 nm at most equal to 29.0 nm, preferably at most equal to 27.0 nm, more preferred at most equal to 25.0 nm, most preferably at most equal to 22.0 nm. Therefore, the geometric thickness of the metal conduction layer is advantageously comprised within the range of two of the preceding values, preferably within the range from 6.0 nm to 29.0 nm, preferably from 8.0 nm to 27.0 nm, more preferred from 10.0 nm to 25.0 nm.

In a particular embodiment, the translucent conductive substrate is such that the transparent electrode formed over the scattering layer, said electrode comprising a single metal conduction layer and at least one coating having properties for improving the light transmission through said electrode, wherein said coating has a geometric thickness at least more than 3.0 nm and at most less than or equal to 200 nm, and said coating comprises at least one layer for improving light transmission and is located between the metal conduction layer and the scattering layer, on which said electrode is deposited, wherein the geometric thickness of the coating having properties for improving the light transmission, $T_{D1}$, and the geometric thickness of the metal conduction layer, $T_{ME}$, are linked by the equation:

$$T_{ME}=T_{ME\_0}+[B^*\sin(\pi^*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9^*n_{D1}$ to $28.3^*n_{D1}$ nm, with $n_{D1}$ representing the refractive index of the coating for improving the light transmission at a wavelength of 550 nm and $n_{support}$ represents the refractive index of the support at a wavelength of 550 nm.

The optical thickness of a layer is obtained by multiplying the geometric thickness of said layer by the refractive index of the material constituting said layer. The value of the refractive index taken is the one at a wavelength of 550 nm.

The inventors have surprisingly found that an electrode stacking structure based on the selection made by the equation linking the geometric thickness of the metal conduction layer, $T_{ME}$, to the geometric thickness of the coating having properties for improving the light transmission, $T_{D1}$, leads to an increase of the amount of light emitted by the OLED.

In a particular embodiment, the translucent conductive substrate according to the invention is such that the transparent electrode formed over the scattering layer, said electrode comprising a single metal conduction layer and at least one coating having properties for improving the light transmission through said electrode, wherein said coating has a geometric thickness at least more than 3.0 nm and at most less than or equal to 200 nm, and said coating comprises at least one layer for improving light transmission and is located between the metal conduction layer and the scattering layer, on which said electrode is deposited, wherein the geometric thickness of the coating having properties for improving the light transmission, $T_{D1}$, and the geometric thickness of the metal conduction layer, $T_{ME}$, are linked by the equation:

$$T_{ME}=T_{ME\_0}+[B^*\sin(\pi^*T_{D1}/T_{D1\_0})]/(n_{ss})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9^*n_{D1}$ to $28.3^*n_{D1}$ nm, with $n_{D1}$ representing the refractive index of the coating for improving the light transmission at a wavelength of 550 nm and $n_{ss}$ represents the refractive index of the stacking structure comprising the support and the scattering layer at a wavelength of 550 nm, where $$n_{ss} = \frac{(n_{support} * l_{support}) + (n_{scatteringlayer} * l_{scatteringlayer})}{(l_{support} + l_{scatteringlayer})}$$

$n_{support}$ representing the refractive index of transparent support at a wavelength of 550 nm, $n_{scatteringlayer}$ representing the refractive index of the scattering layer at a wavelength of 550 nm, $l_{support}$ representing the geometrical thickness of the support and $l_{scatteringlayer}$ representing the geometrical thickness of the scattering layer.

The inventors have surprisingly found that the selection of the electrode stacking structure based on the equation linking the geometric thickness of the metal conduction layer to the geometric thickness of the coating having properties for improving the light transmission, $T_{D1}$, can be adapted in order to take into account the refractive index of the scattering layer (e.g., when the optical thickness of the scattering layer is more than or equal to 0.1% of the optical thickness of the support).

In a particular embodiment, the translucent conductive substrate according to the invention in such that the refractive index of the coating for improving light transmission is higher than the refractive index of the stacking structure comprising the support and the scattering layer at a wavelength of 550 nm.

In a particular embodiment the translucent conductive substrate according to the invention is such that the support has a refractive index, $n_{support}$, in the range of between 1.4 and 1.6 at a wavelength of 550 nm and that the electrode is such that the geometric thickness of the coating having properties for improving light transmission, $T_{D1}$, and the geometric thickness of the metal conduction layer, $T_{ME}$, are linked by the equation:

$$T_{ME}=T_{ME\_0}+[B^*\sin(\pi^*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, preferably 10.0 to 23.0 nm, B having a value in the range of 10.0 to 16.5 nm and $T_{D1\_0}$ having a value in the range of $23.9^*n_{D1}$ to $28.3^*n_{D1}$ nm, with $n_{D1}$ representing the refractive index of the coating for improving the light transmission at a wavelength of 550 nm and $n_{support}$ representing the refractive index of transparent support at a wavelength of 550 nm. Preferably, constants $T_{ME\_0}$, B and $T_{D1\_0}$ are such that $T_{ME\_0}$ has a value in the range of 10.0 to 23.0 nm, preferably 10.0 to 22.5 nm, more preferred 11.5 to 22.5 nm, B has a value in the range of 11.5 to 15.0 and $T_{D1\_0}$ has a value in the range of $24.8^*n_{D1}$ to $27.3^*n_{D1}$ nm. More preferred, constants $T_{ME\_0}$, B and $T_{D1\_0}$ are such that $T_{ME\_0}$ has a value in the range of 10.0 to 23.0 nm, preferably 10.0 to 22.5 nm, more preferred 11.5 to 22.5 nm, B has a value in the range of 12.0 to 15.0 and $T_{D1\_0}$ has a value in the range of $24.8^*n_{D1}$ to $27.3^*n_{D1}$ nm.

According to a particular embodiment, the translucent conductive substrate according to the invention is such the support has a refractive index value, $n_{support}$ in the range of 1.4 to 1.6 and is such that the geometric thickness of the metal conduction layer is at least equal to 6.0 nm, preferably at least equal to 8.0 nm, more preferred at least equal to 10.0 nm and at most equal to 22.0 nm, preferably at most equal to 20.0 nm, more preferred at most equal to 18.0 nm, the geometric thickness of the metal conduction layer is advantageously comprised within the range of two of the preceding values, preferably within the range from 6.0 nm to 22.0 nm, more preferably from 8.0 nm to 20.0 nm, the most preferably 10.0 nm to 18.0 nm, and wherein the geometric thickness of the coating for improving light transmission is at least equal to 50.0 nm, preferably at least equal to 60.0 nm and at most equal to 130.0 nm, preferably at most equal to 110.0 nm, more preferred at most equal to 90.0 nm, the geometric thickness of the coating for improving light transmission is advantageously comprised within the range of two of the preceding values, preferably within the range from 50.0 nm to 110.0 nm, more preferred from 60.0 nm to 90.0 nm.

In a particular embodiment the translucent conductive substrate according to the invention is such that the support has a refractive index value, $n_{support}$ in the range of 1.4 to 1.6 and is such that the geometric thickness of the metal conduction layer is at least equal to 16.0 nm, preferably at least equal to 18.0 nm, more preferred at least equal to 20.0 nm and at most equal to 29.0 nm, preferably at most equal to 27.0 nm, more preferred at most equal to 25.0 nm, the geometric thickness of the metal conduction layer is advantageously comprised within the range of two of the preceding values, preferably within the range from 16.0 nm to 29.0 nm, more preferred from 18.0 nm to 27.0 nm, the most preferred from 20.0 nm to 25.0 nm, and wherein the geometric thickness of the coating for improving light transmission is at least equal to 20.0 nm and at most equal to 40.0 nm. Surprisingly, the use of a thick metal conduction layer combined with an optimized thickness of the coating for improving light transmission allows OLEDs that have a high luminance to be obtained as well as a translucent conductive substrate, in which the electrode has a lower surface resistance expressed in $\Omega/\square$.

In a preferred embodiment the translucent conductive substrate according to the invention is such that the refractive index of the material forming the coating for improving light transmission ($n_{D1}$) is higher than the refractive index of the support ($n_{support}$) ($n_{D1} \times n_{support}$), preferably $n_{D1} > 1.2\ n_{support}$, more preferred $n_{D1} > 1.3\ n_{support}$, most preferred $n_{D1} > 1.5\ n_{support}$. The refractive index of the material forming the coating ($n_{D1}$) has a value ranging from 1.5 to 2.4, preferably ranging from 2.0 to 2.4, more preferred ranging from 2.1 to 2.4 at a wavelength of 550 nm.

When the coating for improving the light transmission is formed from several layers, $n_{D1}$ is given by the equation:

$$n_{D1} = \frac{\sum_{x=1}^{m} n_x \times 1_x}{1_{D1}}$$

where m represents the layer number in the coating, $n_x$ represents the refractive index of the material forming the $x^{-th}$ layer starting from the support, $1_x$ represents the geometric thickness of the $x^{-th}$ layer, $1_{D1}$ represents the geometric thickness of the coating. The use of a material with a higher refractive index allows a higher amount of emitted or transmitted light to be obtained. The advantage provided is all the more significant as the difference between the refractive index of the coating for improving the light transmission and the refractive index of the support is substantial.

The material forming at least one layer of the coating for improving light transmission comprises at least one dielectric compound and/or at least one electrically conductive compound. The term "dielectric compound" is understood to mean at least one compound selected from the following:
the oxides of at least one element selected from Y, Ti, Zr, Hf, V, Nb, Ta, Cr, Mo, W, Ni, Zn, Al, Ga, In, Si, Ge, Sn, Sb, Bi as well as a mixed oxide of at least two thereof
nitrides of at least one element selected from boron, aluminium, silicon, germanium as well as a mixed nitride of at least two thereof;
silicon oxynitride, aluminium oxynitride, mixed oxynitride of silicon-aluminum;
silicon oxycarbide.

If present, the dielectric compound preferably comprises an yttrium oxide, a titanium oxide, a zirconium oxide, a hafnium oxide, a niobium oxide, a tantalum oxide, a zinc oxide, a tin oxide, an aluminium oxide, an aluminium nitride, a silicon nitride and/or a silicon oxycarbide.

The term "conductive" is understood to relate to a compound chosen from the following:
oxides under-stoichiometric in oxygen and doped oxides of at least one element selected from Ti, Zr, Hf, V, Nb, Ta, Cr, Mo, W, Zn, Al, Ga, In, Si, Ge, Sn, Sb, Bi as well as a mixed oxide under-stoichiometric in oxygen or a doped mixed oxide of at least two thereof;
doped nitrides of at least one element selected from boron, aluminium, silicon, germanium as well as a mixed doped nitride of at least two thereof;
doped Si oxycarbide;
the doping agents preferably comprise at least one of the elements chosen from Al, Ga, In, Sn, P, Sb, F. In the case of silicon oxynitride the doping agents comprise B, Al and/or Ga.

The conductive compound preferably comprises at least ITO and/or doped Sn oxide, wherein the doping agent is at least one element chosen from F and Sb, and/or doped Zn oxide, wherein the doping agent is at least one element chosen from Al, Ga, Sn, Ti. According to a preferred embodiment, the inorganic chemical compound comprises at least $ZnO_x$ (where $x \le 1$) and/or $Zn_xSn_yO_z$ (where $x+y \ge 3$ and $z \le 6$). $Zn_xSn_yO_z$ preferably comprises at most 95% by total weight of the metals present in the layer.

The metal conduction layer of the electrode forming a part of the translucent conductive substrate according to the invention mainly assures the electrical conduction of said electrode. It comprises at least one layer composed of a metal or a mixture of metals. The generic term "mixture of metals" denotes the combinations of at least two metals in the form of an alloy or doping of at least one metal by at least one other metal, wherein the metal and/or the mixture of metals comprises at least one element selected from Pd, Pt, Cu, Ag, Au, Al. The metal and/or mixture of metals preferably comprises at least one element selected from Cu, Ag, Au, Al. More preferred, the metal conduction layer comprises at least Ag in pure form or alloyed to another metal. The other metal preferably comprises at least one element selected from Au, Pd, Al, Cu, Zn, Cd, In, Si, Zr, Mo, Ni, Cr, Mg, Mn, Co, Sn. More preferred, the other metal comprises at least Pd and/or Au, preferably Pd. The inventors have found that the geometric thickness of the metal conduction layer must be at least equal to 6.0 nm in order to obtain a good conductivity of the electrode, in other words a low electrical resistance.

According to a particular embodiment, the coating for improving the light transmission of the electrode forming a part of the translucent conductive substrate according to the invention comprises at least one additional crystallisation layer, wherein, in relation to the support, said layer is the layer furthest removed from the stacking structure forming said coating. This layer allows a preferred growth of the metal layer, e.g. of silver, forming the metal conduction layer and thus allows favourable electrical and optical properties of the metal conduction layer to be obtained. It comprises at least one inorganic chemical compound. The inorganic chemical compound forming the crystallisation layer does not necessarily have a high refractive index. The inorganic chemical compound comprises at least ZnO (where x≤1) and/or $Zn_xS_{n_y}O_z$ (where x+y≥3 and z≤6). $Zn_xSn_yO_z$ preferably comprises at most 95% by weight of zinc, the percentage by weight of zinc being expressed in relation to the total weight of the metals present in the layer. The crystallisation layer is preferably composed of ZnO. Since the layer having properties for improving light transmission has a generally greater thickness than is usually encountered in the field of multilayer conductive coatings (e.g. low emission type coating), the thickness of the crystallisation layer must be adapted or increased to provide a metal conduction layer with good conduction and very low absorption.

According to a particular embodiment, the geometric thickness of the crystallisation layer is at least equal to 7% of the total geometric thickness of the coating for improving light transmission and preferably 11%, more preferred 14%. For example, in the case of a coating for improving light transmission comprising a layer for improving light transmission and a crystallisation layer, the geometric thickness of the layer for improving light transmission must be reduced if the geometric thickness of the crystallisation layer is increased in order to comply with the relation between the geometric thickness of the metal conduction layer and the optical thickness of the coating for improving light transmission.

According to a particular embodiment, the crystallisation layer is merged with at least one layer for improving light transmission forming the coating for improving light transmission.

According to a particular embodiment, the coating for improving light transmission comprises at least one additional barrier layer, wherein, in relation to the scattering layer, said barrier layer is the layer closest to the stacking structure forming said coating. This layer in particular allows the electrode to be protected from any contamination by the migration of alkaline substances coming from the support, e.g. made of soda-lime-silica glass, or from the scattering layer and thus enables the service life of the electrode to be extended. The barrier layer comprises at least one compound selected from the following:

- titanium oxide, zirconium oxide, aluminium oxide, yttrium oxide as well as a mixed oxide of at least two thereof;
- mixed oxide of zinc-tin, zinc-aluminium, zinc-titanium, zinc-indium, tin-indium;
- silicon nitride, silicon oxynitride, silicon oxycarbide, silicon oxycarbonitride, aluminium nitride, aluminium oxynitride, a mixed nitride of aluminium-silicon, a mixed oxynitride of aluminium-silicon;
- wherein this barrier layer is possibly doped or alloyed with tin.

According to a particular embodiment, the barrier layer is merged with at least one layer for improving light transmission forming the coating for improving light transmission.

According to a preferred embodiment of the barrier and crystallisation layers, at least one of these two additional layers is merged with at least one layer for improving light transmission forming the coating for improving light transmission.

In a particular embodiment the translucent conductive substrate according to the invention is such that the electrode partly forming it comprises a thin layer for homogenizing the surface electrical properties located, which, in relation to the scattering layer, is located at the top of the multilayer stacking structure forming said electrode. The main function of the thin layer for homogenizing the surface electrical properties is to allow a uniform transfer of charge to be obtained over the entire surface of the electrode. This uniform transfer is indicated by a balanced flux of emitted light at every point of the surface. It also enables the service life of the OLED to be increased, since this transfer is the same at each point, thus eliminating any possible hot spots. The homogenisation layer has a geometric thickness of at least 0.5 nm, preferably of at least 1.0 nm. The homogenisation layer has a geometric thickness of at most 6.0 nm, preferably at most 2.5 nm, more preferred at most 2.0 nm. It is more preferred that the homogenisation layer is equal to 1.5 nm. Therefore, the geometric thickness of the homogenisation layer is advantageously comprised within the range of two of the preceding values, preferably within the range from 0.5 nm to 6.0 nm, more preferably from 1.0 nm to 2.5 nm, the most preferably from 1.0 nm to 2.0 nm. The homogenisation layer comprises at least one layer composed of at least one inorganic material selected from a metal, a nitride, an oxide, a carbide, an oxynitride, an oxycarbide, a carbonitride, an oxycarbonitride.

According to a first particular practical example of the previous embodiment, the inorganic material of the homogenisation layer is composed of a single metal or a mixture of metals. The generic term "mixture of metals" denotes the combinations of at least two metals in the form of alloy or doping of at least one metal by at least one other metal. The homogenisation layer is composed of at least one element selected from Li, Na, K, Be, Mg, Ca, Ba, Sc, Y, Ti, Zr, Hf, Ce, V, Nb, Ta, Cr, Mo, W, Mn, Fe, Ru, Co, Rh, Ir, Ni, Pd, Pt, Cu, Ag, Au, Zn, B, Al, Ga, In, TI, C, Si, Ge, Sn, Pb. The metal and/or mixture of metals comprises at least one element selected from Li, Na, K, Mg, Ca, Ti, Zr, Hf, V, Nb, Ta, Cr, Mo, W, Mn, Co, Ni, Pd, Pt, Cu, Ag, Au, Zn, Cd, Al, Si, C. It is more preferred that the metal or the mixture of metals comprises at least one element selected from C, Ti, Zr, Hf, V, Nb, Ta, Ni, Cr, Al, Zn. The mixture of metals preferably comprises Ni—Cr and/or Zn doped with Al. The advantage provided by this particular example is that it allows a better possible compromise to be reached between the electrical properties resulting from the effect of the layer for homogenizing surface electrical properties, on the one hand, and the optical properties obtained as a result of the improvement coating, on the other. The use of a homogenisation layer that has the lowest possible thickness is a basic requirement. In fact, the influence of this layer on the amount of light emitted by the OLED is all the less when its thickness is low. Therefore, if metallic, this homogenisation layer is distinguished from the conduction layer by its lower thickness, since this thickness is insufficient to assure conductivity. It is therefore preferred that the homogenisation layer has a geometric thickness of 5.0 nm at most, if it is metallic, i.e. composed of a single metal or a mixture of metals.

According to a second particular embodiment, the inorganic material of the homogenisation layer is present in the form of at least one chemical compound selected from carbides, carbonitrides, oxynitrides, oxycarbides, oxycarbonitrides as well as mixtures of at least two thereof. The oxynitrides, oxycarbides, oxycarbonitrides of the homogenisation layer can be in non-stoichiometric, preferably under-stoichiometric, form in relation to oxygen. The carbides are carbides of at least one element selected from Be, Mg, Ca, Ba, Sc, Y, Ti, Zr, Hf, Ce, V, Nb, Ta, Cr, Mo, W, Mn, Fe, Co, Rh, Ir, Ni, Pd, Pt, Cu, Au, Zn, Cd, B, Al, Si, Ge, Sn, Pb, preferably at least one element selected from Ti, Zr, Hf, V, Nb, Ta, Cr, Mo, W, Mn, Co, Ni, Pd, Pt, Cu, Au, Zn, Cd, Al, Si, more preferred at least one element selected from Ti, Zr, Hf, V, Nb, Ta, Ni, Cr, Zn, Al. The carbonitrides are carbonitrides of at least one element selected from Be, Sc, Y, Ti, Zr, Hf, V, Nb, Cr, Mo, W, Fe, Co, Zn, B, Al, Si, preferably of at least one element selected from Ti, Zr, Hf, V, Nb, Ta, Cr, Mo, W, Co, Zn, Al, Si, more preferred of at least one element selected from Ti, Zr, Hf, V, Nb, Ta, Cr, Zn, Al. The oxynitrides are oxynitrides of at least one element selected from Be, Mg, Ca, Sr, Sc, Y, Ti, Zr, Hf, V, Nb, Ta, Cr, Mo, W, Mn, Fe, Co, Rh, Ir, Ni, Cu, Au, Zn, B, Al, Ga, In, Si, Ge, preferably of at least one element selected from Ti, Zr, Hf, V, Nb, Ta, Cr, Mo, W, Mn, Co, Ni, Cu, Au, Zn, Al, Si, more preferred of at least one element selected from Ti, Zr, Hf, V, Nb, Ta, Cr, Zn, Al. The oxycarbides are oxycarbides of at least one element selected from Be, Mg, Ca, Sr, Sc, Y, Ti, Zr, Hf, V, Nb, Cr, Mo, W, Mn, Fe, Ni, Zn, Si, Ge, preferably of at least one element selected from Ti, Zr, Hf, V, Nb, Cr, Mo, W, Mn, Ni, Zn, Al, Si, more preferred of at least one element selected from Ti, Zr, Hf, V, Nb, Cr, Zn, Al. The oxycarbonitrides are oxycarbonitrides of at least one element selected from Be, Ti, Zr, Hf, V, Nb, Cr, Mo, W, Mn, Zn, B, Al, Si, Ge, preferably of at least one element selected from Ti, Zr, Hf, V, Nb, Cr, Mo, W, Mn, Zn, Al, Sn, more preferred of at least one element selected from Ti, Zr, Hf, V, Nb, Cr, Zn, Al. The carbides, carbonitrides, oxynitrides, oxycarbides, oxycarbonitrides of the layer for homogenizing surface electrical properties possibly comprise at least one doping element. In a preferred embodiment, the thin homogenisation layer comprises at least one oxynitride composed of at least one element selected from Ti, Zr, Cr, Mo, W, Mn, Co, Ni, Cu, Au, Zn, Al, Si. More preferred the thin layer for homogenizing surface electrical properties comprises at least one oxynitride selected from Ti oxynitride, Zr oxynitride, Ni oxynitride, NiCr oxynitride.

According to a third particular embodiment, the inorganic material of the homogenisation layer is present in the form of at least one metal nitride of at least one element selected from Be, Mg, Ca, Sr, Ba, Sc, Y, Ti, Zr, Hf, V, Nb, Ta, Cr, Mo, W, Mn, Fe, Ru, Os, Co, Rh, Ir, Ni, Pd, Pt, Cu, Ag, Au, Zn, Cd, B, Al, Ga, In, Si, Ge, Sn. Preferably, the homogenisation layer comprises at least one nitride of an element selected from Ti, Zr, Hf, V, Nb, Ta, Cr, Mo, W, Mn, Co, Ni, Pd, Pt, Cu, Ag, Au, Zn, Cd, Al, Si. More preferred, the nitride comprises at least one element selected from Ti, Zr, Hf, V, Nb, Ta, Ni, Cr, Al, Zn. More preferred, the thin layer for homogenizing surface electrical properties comprises at least Ti nitride, Zr nitride, Ni nitride, NiCr nitride.

According to a fourth particular embodiment, the inorganic material of the homogenisation layer is present in the form of at least one metal oxide of at least one element selected from Be, Mg, Ca, Sr, Ba, Sc, Y, Ti, Zr, Hf, V, Nb, Ta, Cr, Mo, W, Mn, Fe, Ru, Os, Co, Rh, Ir, Ni, Pd, Pt, Cu, Ag, Au, Zn, Cd, B, Al, Ga, In, Si, Ge, Sn, Pb. Preferably, the homogenisation layer comprises at least one oxide of an element selected from Ti, Zr, Hf, V, Nb, Ta, Cr, Mo, W, Mn, Co, Ni, Pd, Pt, Cu, Ag, Au, Zn, Cd, Al, In, Si, Sn. More preferred, the oxide comprises at least one element selected from Ti, Zr, Hf, V, Nb, Ta, Ni, Cu, Cr, Al, In, Sn, Zn. The oxide of the homogenisation layer can be a under-stoichiometric oxide in oxygen. The oxide possibly comprises at least one doping element. Preferably, the doping element is selected from at least one of the element chosen from Al, Ga, In, Sn, Sb, F, Ag. More preferred, the thin layer for homogenizing surface electrical properties comprises at least Ti oxide and/or Zr oxide and/or Ni oxide and/or NiCr oxide and/or ITO and/or doped Cu oxide, wherein the doping agent is Ag, and/or doped Sn oxide, wherein the doping agent is at least one element selected from F and Sb, and/or doped Zn oxide, wherein the doping agent is at least one element selected from Al, Ga, Sn, Ti.

In a particular embodiment the translucent conductive substrate according to the invention is such that the electrode partly forming it comprises at least one additional insertion layer located between the metal conduction layer and the thin homogenisation layer. The layer inserted between the metal conduction layer and the homogenisation layer comprises at least one layer composed of at least one dielectric compound and/or at least one electrically conductive compound. Preferably, the insertion layer comprises at least one layer composed of at least one conductive compound. The function of this insertion layer is to form a part of an optical cavity that enables the metal conduction layer to become transparent. The term "dielectric compound" is understood to mean at least one compound selected from the following:

the oxides of at least one element selected from Y, Ti, Zr, Hf, V, Nb, Ta, Cr, Mo, W, Zn, Al, Ga, In, Si, Ge, Sn, Sb, Bi as well as the mixed oxide of at least two thereof:

the nitrides of at least one element selected from boron, aluminium, silicon, germanium as well as a mixed nitride of at least two thereof;

silicon oxynitride, aluminium oxynitride, mixed oxynitride of silicon-aluminum;

a silicon oxycarbide.

If present, the dielectric compound preferably comprises an yttrium oxide, a titanium oxide, a zirconium oxide, a hafnium oxide, a niobium oxide, a tantalum oxide, a zinc oxide, a tin oxide, an aluminium oxide, an aluminium nitride, a silicon nitride and/or a silicon oxycarbide.

The term "conductive" is understood to relate to a compound chosen from the following:

under-stoichiometric oxides in oxygen and doped oxides of at least one element selected from Y, Ti, Zr, Hf, V, Nb, Ta, Cr, Mo, W, Zn, Al, Ga, In, Si, Ge, Sn, Sb, Bi as well as a mixed under-stoichiometric oxides in oxygen, a mixed doped oxides of at least two thereof;

doped nitrides of at least one element selected from boron, aluminium, silicon, germanium as well as a mixed doped nitride of at least two thereof;

doped Si oxycarbide;

the doping agents preferably comprise at least one of the elements chosen from Al, Ga, In, Sn, P, Sb, F. In the case of silicon oxynitride the doping agents comprise B, Al and/or Ga.

The conductive compound preferably comprises at least ITO and/or doped Sn oxide, wherein the doping agent is at least one element chosen from F and Sb, and/or doped Zn oxide, wherein the doping agent is at least one element chosen from Al, Ga, Sn, Ti. According to a preferred embodiment, the inorganic chemical compound comprises at least $ZnO_x$ (where $x \leq 1$) and/or $Zn_xSn_yO_z$ (where $x+y \geq 3$ and $z \leq 6$). $Zn_xSn_yO_z$ preferably comprises at most 95% by weight of zinc, and the percentage by weight of zinc is expressed in relation to the total weight of the metals present in the layer.

In a particular embodiment of the previous embodiment, the translucent conductive substrate according to the invention is such that the geometric thickness of the insertion layer ($E_{in}$) is such that its ohmic thickness is at most equal to $10^{12}$ ohm, preferably at most equal to $10^4$ ohm, wherein the ohmic thickness is equal to the ratio between the resistivity of the material forming the insertion layer (·), on the one hand, and the geometric thickness of this same layer (l), on the other; the geometric thickness of the insertion layer is, moreover, linked to the geometric thickness of the first organic layer of the organic light-emitting device ($E_{org}$), the term "first organic layer" denoting all the organic layers disposed between the insertion layer and the organic light-emitting layer, by the equation: $E_{org}=A-E_{in}$, where A is a constant having a value in the range of 5.0 to 75.0 nm, preferably from 20.0 to 60.0 nm, more preferred from 30.0 to 45.0 nm. The inventors have found that the equation $E_{org}=A-E_{in}$ surprisingly allows the geometric thickness of the first organic layer of the organic light-emitting device to be used to optimize the optical parameters (geometric thickness and refractive index) of the insertion layer and therefore to optimize the amount of light transmitted while retaining a thickness of the insertion layer that is compatible with the electrical properties that enable high ignition voltages, i.e. for a first luminance maximum, to be avoided.

In another particular embodiment, the translucent substrate according to the invention is such that the geometric thickness of the insertion layer ($E_{in}$) is such that its ohmic thickness is at most equal to $10^{12}$ ohm, preferably at most equal to $10^4$ ohm, wherein the ohmic thickness is equal to the ratio between the resistivity of the material forming the insertion layer (·), on the one hand; the geometric thickness of this same layer (l), on the other; and the geometric thickness of the insertion layer is, moreover, linked to the geometric thickness of the first organic layer of the organic light-emitting device ($E_{org}$), the term "first organic layer" denoting all the organic layers disposed between the insertion layer and the organic light-emitting layer, by the equation: $E_{org}=C-E_{in}$, where C is a constant having a value in the range of 150.0 to 250.0 nm, preferably from 160.0 to 225.0 nm, more preferred from 75.0 to 205.0 nm. The inventors have found that the equation $E_{org}=C-E_{in}$ surprisingly allows the geometric thickness of the first organic layer of the organic light-emitting device to be used to optimize the optical parameters (geometric thickness and refractive index) of the insertion layer and therefore to optimize the amount of light transmitted while retaining a thickness of the insertion layer that is compatible with the electrical properties that enable high ignition voltages, i.e. for a second luminance maximum, to be avoided.

In another particular embodiment of the translucent conductive substrate according to the invention is such that the metal conduction layer of the electrode comprises at least one sacrificial layer on at least one of its faces. Sacrificial layer is understood to mean a layer that can be fully or partially oxidised or nitrided. This layer allows deterioration of the metal conduction layer, in particular as a result of oxidation or nitridation, to be avoided. Moreover, although it can be located between the metal conduction layer and the crystallisation layer, the presence of this sacrificial layer is compatible with the action of a crystallisation layer. If present, the sacrificial layer comprises at least one compound selected from metals, nitrides, oxides, under-stoichiometric metal oxides in oxygen. Preferably, the metals, nitrides, oxides, under-stoichiometric metal oxides in oxygen comprise at least one element selected from Ti, Zr, Hf, V, Nb, Ta, Cr, Mo, W, Mn, Fe, Co, Ni, Cu, Zn, Al. The sacrificial layer preferably comprises at least Ti, Zr, Ni, Zn, Al. Most preferred, the sacrificial layer comprises at least Ti, $TiO_x$ (where x≤2), NiCr, $NiCrO_x$, $TiZrO_x$ ($TiZrO_x$ indicates a titanium oxide layer with 50% by weight of zirconium oxide), $ZnAlO_x$ ($ZnAlO_x$ indicates a zinc oxide layer with 2 to 5% by weight of aluminium oxide). According to a particular embodiment in keeping with the above, the thickness of the sacrificial layer has a geometric thickness of at least 0.5 nm. The thickness of the sacrificial layer comprises a thickness of at most 6.0 nm, preferably of at most 5.0 nm. It is more preferred if the thickness is equal to 2.5 nm. Therefore, the geometric thickness of the sacrificial layer is advantageously comprised within the range of two of the preceding values, preferably within the range from 0.5 to 6.0 nm, more preferably from 0.5 to 5 nm. According to a preferred embodiment, a sacrificial layer is deposited on the face of the metal conduction layer furthest removed in relation to the support.

In another particular embodiment the translucent conductive substrate according to the invention is such that the stacking structure comprising the support and the scattering layer on which the electrode is deposited, comprises at least one functional coating on the face opposite the face, on which the electrode is deposited. This coating comprises at least one coating selected from an antireflective layer or multilayer stacking structure, a diffusion layer, a non-fogging or anti-soiling layer, an optical filter, in particular a titanium oxide layer, a selective absorbent layer, a micro-lens system such as those described in the article by Lin and Coll., for example. in Optics Express, 2008, vol. 16, no. 15, pp. 11044-11051 or in document US 2003/0020399 A1, page 6.

In a preferred embodiment the translucent conductive substrate according to the invention essentially has the following structure, starting from a clear or extra-clear glass support:

a scattering layer formed over the transparent support and comprising a glass which contains a base material having a first refractive index for at least one wavelength of light to be transmitted and a plurality of scattering materials dispersed in the base material and having a second refractive index different from that of the base material, said scattering layer having a geometrical thickness in the range of 10 μm to 60 μm, a coating for improving light transmission comprising:
  a layer for improving light transmission made of $TiO_2$ (merged with the barrier layer),
  a crystallisation layer made of ZnO or $Zn_xSn_yO_z$ (where x+y≥3 and z≤6), a metal conduction layer made of Ag, wherein the geometric thickness of the coating having properties for improving light transmission and the geometric thickness of the metal conduction layer are linked by the equation:

$$T_{ME}=T_{ME\_0}+[B*\sin(\pi*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, preferably 10.0 to 23.0 nm, B having a value in the range of 10.0 to 16.5 nm and $T_{D1\_0}$ having a value in the range of $23.9*n_{D1}$ to $28.3*n_{D1}$ nm, with $n_{D1}$ representing the refractive index of the coating for improving light transmission at a wavelength of 550 nm and $n_{support}$ represents the refractive index of the support at a wavelength of 550 nm. Preferably, constants $T_{ME\_0}$, B and $T_{D1\_0}$ are such that $T_{ME\_0}$ has a value in the range of 10.0 to 23.0 nm, preferably 10.0 to 22.5 nm, more preferred 11.5 to 22.5 nm, B has a value in the range of 11.5 to 15.0 and $T_{D1\_0}$ has a value in the range of $24.8*n_{D1}$ to $27.3*n_{D1}$ nm. More preferred, constants $T_{ME\_0}$, B and $T_{D1\_0}$ are such that $T_{ME\_0}$ has a value in the range of 10.0 to 23.0 nm, preferably 10.0 to 22.5 nm, more preferred 11.5 to 22.5 nm, B has a value in the range of 12.0 to 15.0 and $T_{D1\_0}$ has a value in the range of $24.8*n_{D1}$ to $27.3*n_{D1}$ nm, a sacrificial layer: geometric thickness 1.0-3.0 nm made of Ti or $TiO_x$ (x≤2), an insertion layer: geometric thickness 3.0-20.0 nm made of $Zn_xSn_yO_z$ (where x+y≥3 and z≤6), a homogenisation layer: geometric thickness 0.5-3.0 nm made of X, X nitride, X oxynitride where X: Ti, Zr, Hf, V, Nb, Ta, Ni, Pd, Cr, Mo, Al, Zn, Ni—Cr or Zn doped with Al.

In a preferred embodiment the translucent conductive substrate according to the invention essentially has the following structure, starting from a clear or extra-clear glass support:

a scattering layer formed over the transparent support and comprising a glass which contains a base material having a first refractive index for at least one wavelength of light to be transmitted and a plurality of scattering materials dispersed in the base material and having a second refractive index different from that of the base material, said scattering layer having a geometrical thickness in the range of 10 µm to 60 µm, coating for improving light transmission:

layer for improving light transmission made of $TiO_2$ (merged with the barrier layer), crystallisation layer made of ZnO or $Zn_xSn_yO_z$ (where x+y≥3 and z≤6), the geometric thickness of the coating for improving light transmission is at least equal to 50.0 nm, preferably at least equal to 60.0 nm, more preferred at least equal to 70.0 nm and at most equal to 100 nm, preferably at most equal to 90.0 nm, more preferred at most equal to 80.0 nm, therefore the geometric thickness of the coating from improving light transmission is advantageously comprised within the range of two of the preceding values, preferably within the range from 50.0 nm to 100.0 nm, more preferably from 60.0 nm to 90.0 nm, the most preferably from 70.0 nm to 80.0 nm.

a metal conduction layer made of Ag, wherein the geometric thickness of the metal conduction layer is at least equal to 6.0 nm, preferably at least equal to 8.0 nm, more preferred at least equal to 10.0 nm and at most equal to 22.0 nm, preferably at most equal to 20.0 nm, more preferred at most equal to 18.0 nm, therefore the geometric thickness of the metal conduction layer is advantageously comprised within the range of two of the preceding values, preferably within the range from 6.0 nm to 22.0 nm, more preferably from 8.0 nm to 20.0 nm, the most preferably from 10.0 nm to 18.0 nm.

a sacrificial layer: geometric thickness 1.0-3.0 nm made of Ti or $TiO_x$ (x≤2), an insertion layer: geometric thickness 3.0-20.0 nm made of $Zn_xSn_yO_z$ (where x+y≥3 and z≤6), a homogenisation layer: geometric thickness 0.5-3.0 nm made of X, X nitride, X oxynitride where X: Ti, Zr, Hf, V, Nb, Ta, Ni, Pd, Cr, Mo, Al, Zn, Ni—Cr or Zn doped with Al.

In a preferred embodiment the translucent conductive substrate according to the invention essentially has the following structure, starting from a clear or extra-clear glass support:

a scattering layer formed over the transparent support and comprising a glass which contains a base material having a first refractive index for at least one wavelength of light to be transmitted and a plurality of scattering materials dispersed in the base material and having a second refractive index different from that of the base material, said scattering layer having a geometrical thickness in the range of 10 µm to 60 µm, a coating for improving light transmission:

a layer for improving light transmission made of $TiO_2$ (merged with the barrier layer), a crystallisation layer made of ZnO or $Zn_xSn_yO_z$ (where x+y≥3 and z≤6), the geometric thickness of the coating for improving light transmission is at least equal to 20.0 nm and at most equal to 40.0 nm, a metal conduction layer made of Ag, wherein the geometric thickness of the metal conduction layer is at least equal to 16.0 nm, preferably at least equal to 18.0 nm, more preferred at least equal to 20.0 nm and at most equal to 29.0 nm, preferably at most equal to 27.0 nm and most preferred at most equal to 25.0 nm, therefore, the geometric thickness of the metal conduction layer is advantageously comprised within the range of two of the preceding values, preferably within the range from 16.0 nm to 29.0 nm, more preferably from 18.0 nm to 27.0 nm, the most preferably from 20.0 nm to 25.0 nm.

a sacrificial layer: geometric thickness 1.0-3.0 nm made of Ti or $TiO_x$ (x≤2), an insertion layer: geometric thickness 3.0-20.0 nm made of $Zn_xSn_yO_z$ (where where x+y≥3 and z≤6), a homogenisation layer: geometric thickness 0.5-3.0 nm made of X, X nitride, X oxynitride where X: Ti, Zr, Hf, V, Nb, Ta, Ni, Pd, Cr, Mo, Al, Zn, Ni—Cr or Zn doped with Al.

The embodiments of the translucent conductive substrate are not limited to the embodiments outlined above, but can equally be formed by combining two or more thereof.

The second subject of the invention relates to a method for the manufacture of the translucent conductive substrate according to the invention. This substrate comprises a support, a scattering layer and an electrode. The process for the manufacture of the translucent conductive substrate according to the invention is a process, in which:

the scattering layer is made as follow: oxide, phosphate, metaphosphate, carbonate, nitrate, hydroxide or other materials are used as starting materials to make the scattering layer. First, they are scaled to become the predetermined amount, and the collected materials are mixed. Then, the mixed materials are dissolved at a temperature of from 950 to 1500° C. by using a platinum crucible and so on. Then, the dissolved materials are poured into a mould or the gap of twin roll. The poured materials are rapidly cooled in order to have a glass of the invention. There is a possibility of cooling gradually to remove the distortion, too. The invention is used in the form of glass frit which was prepared by the method above. The glass is crushed by using a mortar, ball mill, jet mill grinding due and so on or is classified if necessary to get the glass frit. Mass average particle size of glass frit is typically 0.5 to 10 microns. The surface of the glass frit can be reformed by a surfactant or a silane coupling agent. If necessary, it is also possible to mix the solvent, the binder, etc. and this glass frit. The mixed glass frit is coated on a transparent support and is fired at the temperature higher than about 60° C. in comparison with the glass transition temperature of the glass frit to cause the glass frit soften. After being cooled to room temperature, a transparent support with a scattering layer is obtained. As a solvent, ether type solvents (butyl carbitol (BC), butyl carbitol acetate (BCA), diethylene glycol di-n-butyl ether, dipropylene glycol dibutyl ether, tripropylene glycol butyl ether and butyl cellulosolve acetate), alcohol type solvents (·-terpineol, pine oil and Dowanol), ester type solvent (2,2,4-trimethyl-1,3-pentanediol monoisobutyrate, and phtalic acid ester type solvents (DBP (dibutyl phthalate), DMP (dimethyl phthalate) and DOP (dioctyl phthalate)) are used. Mainly used are ·-terpineol and 2,2,4-trimethyl-1,3-pentanediol monoisobutyrate. Incidentally, DBP (dibutyl phthalate), DMP (dimethyl phthalate) and DOP (dioctyl phthalate) also function as a plasticizer. As a binder, ethyl cellulose, nitrocellulose, an acrylic resin, vinyl acetate resin, a butyral resin, a melamine resin, an alkyd resin, a rosin resin or the like. Used as base resins are ethyl cellulose and nitrocellulose. Incidentally, a butyral resin, a melamine resin, an alkyd resin and a rosin resin are used as additives for improving coated film strength. Within the range where the purpose of this invention is not ruined, any ingredients other than binder or solvent may be introduced. In the case that the binder is used, before the glass frit is soften, it is desirable to contain the process of firing at a temperature that is lower than the glass transition temperature and evaporating the binder. The inventors have surprisingly found that the preferred firing temperature value is comprised in the range from 530° C. to 580° C.

the electrode is made by deposition on the scattering layer of at least one layer of the stacking structure constituting said electrode thanks to a method selected from cathodic sputtering techniques, possibly using a magnetic field, deposition techniques using plasma, CVD (chemical vapour deposition) and/or PVD (physical vapour deposition) techniques. The deposition method is preferably conducted under vacuum. The term "under vacuum" denotes a pressure lower than or equal to 2.0 Pa. More preferred, the process under vacuum is a magnetron sputtering technique. The process for the manufacture of the translucent conductive substrate comprises continuous processes, in which every layer forming the electrode is deposited immediately after the layer underlying it in the multilayer stacking structure (e.g. deposition of the stacking structure forming the electrode according to the invention onto a support that is a moving ribbon or deposition of the stacking structure onto a support that is a panel). The manufacturing process also comprises discontinuous processes in which a time interval (e.g. in the form of storage) separates the deposition of one layer and the layer underlying it in the stacking structure forming the electrode.

According to a preferred embodiment, the method for the manufacture of the translucent conductive substrate according to the invention is such that it is conducted in three phases as follows:

deposition of the scattering layer on the transparent support
deposition of the support of the coating having properties for improving light transmission,
deposition of the metal conduction layer directly followed by deposition of the different functional elements forming the OLED system.

According to another preferred embodiment, the process for the manufacture of the translucent conductive substrate according to the invention is such that it is conducted in three phases as follows:

deposition of the scattering layer on the transparent support
deposition of the support of the coating having properties for improving light transmission through the electrode, the metal conduction layer, the sacrificial layer, the insertion layer,
deposition of the homogenisation layer directly followed by deposition of the different functional elements forming the OLED system.

When the homogenisation layer or metal conduction layer are deposited at a later stage, the organic portion of the OLED is deposited immediately after deposition of the homogenisation layer or the metal conduction layer, i.e. without the homogenisation layer or the metal conduction layer being exposed before deposition of the organic portion of the OLED. The advantage provided by these processes is that oxidation of the conduction and homogenisation layers can be avoided when these are made of metal.

According to a particular embodiment, the layer for homogenizing the surface electrical properties based on oxides and/or oxynitrides can be obtained by direct deposition. According to an alternative example, the homogenisation layer based on oxides and/or oxynitrides can be obtained by oxidation of the metals and/or the corresponding nitrides (e.g. Ti is oxidised in Ti oxide, Ti nitride is oxidised in Ti oxynitride). This oxidation can occur directly or a long time after deposition of the homogenisation layer. The oxidation can be natural (e.g. through interaction with an oxidising compound present during the manufacturing process or during storage of the electrode before complete manufacture of the OLED) or can result from a post-treatment operation (e.g. treatment in ozone under ultraviolet light).

According to an alternative embodiment, the process comprises an additional step of structuring the surface of the electrode. Structuring of the electrode is different from structuring of the support. This additional step consists of shaping the surface and/or decorating the surface of the electrode. The process of shaping the surface of the electrode comprises at least engraving by laser or etching. The process of decorating the surface comprises at least a masking operation. Masking is the operation in which a portion at least of the surface of the electrode is covered with a protective coating as part of a post-treatment process, e.g. etching of the uncoated parts.

In a third object of the invention the translucent conductive substrate according to the present invention is incorporated into an OLED that emits light.

According to a variation of the previous embodiment, the organic light-emitting device comprises an OLED system above the substrate according to the invention for the purpose of emitting a quasi-white light. Several methods are possible to produce a quasi-white light: by mixing within a single organic layer compounds that emit red, green and blue light, by laminating three organic layer structures corresponding respectively to the emitter parts of red, green and blue light or two organic layer structures (yellow and blue emission), by juxtaposing three (red, green blue emission) or two (yellow and blue emission) organic layer structures connected to a light diffusion system.

The term "quasi-white light" is understood to mean a light in which, with a perpendicular radiation to the surface of the substrate, the chromatic coordinates at 0° are contained in one of the eight chromaticity quadrilaterals, with contours of the quadrilaterals included. These quadrilaterals are defined in pages 10 to 12 of standard ANSI_NEMA_ANSLG C78.377-2008. These quadrilaterals are shown in FIG. A1, part 1 entitled "Graphical representation of the chromaticity specification of SSL products in Table 1, on the CIE (x,y) chromaticity diagram".

According to a particular embodiment, the organic light-emitting device is integrated into a glazing, a double glazing or a laminated glazing. It is also possible to integrate several organic light-emitting devices, preferably a large number of organic light-emitting devices.

According to another particular embodiment, the organic light-emitting device is enclosed in at least one encapsulation material made of glass and/or plastic. The different embodiments of the organic light-emitting devices can be combined.

Finally, the different organic light-emitting devices have an extensive field of application. The invention concerns in particular possible uses of these organic light-emitting devices in the formation of one or more luminous surfaces. The term "luminous surface" includes, for example, lighting tiles, luminous panels, luminous partitions, work surfaces, glasshouses, flashlights, screen bases, drawer bases, luminous roofs, touch screens, lamps, camera flash systems, luminous bases for display, security lights and shelves.

The translucent conductive substrate according to the invention will now be illustrated on the basis of the following figures. The figures show in a non-restrictive manner some substrate structures. These figures are purely for illustration purposes and do not constitute a representation of structures to scale.

Figure 5:
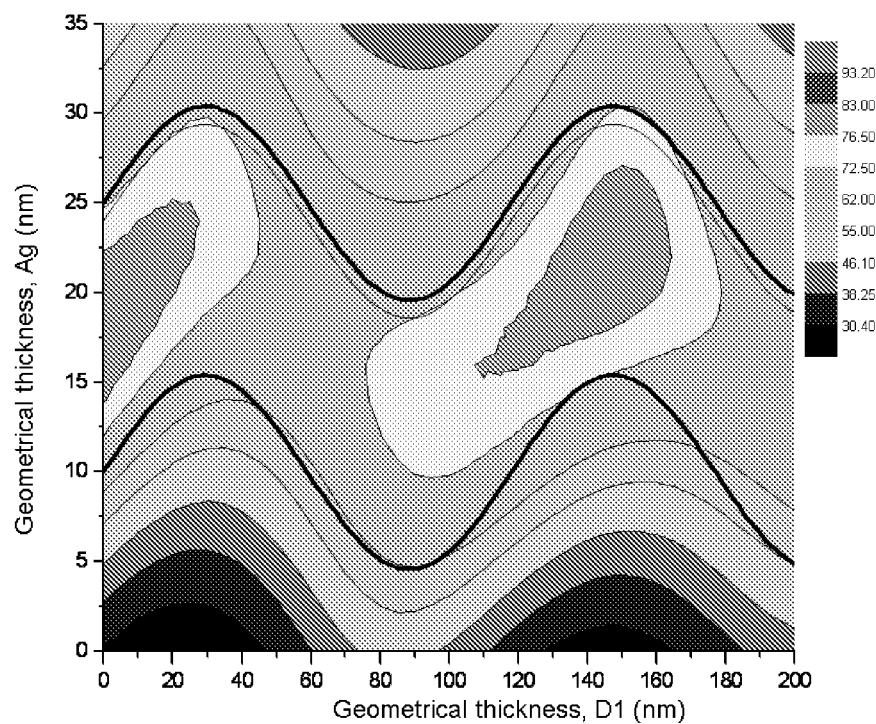

FIG. 5 shows the evolution of the luminance of an organic light-emitting device emitting a quasi-white light and comprising a substrate without the scattering layer and having a transparent support with a refractive index of 1.4 at a wavelength equal to 550 nm as a function of the geometric thickness of the coating for improving the light transmission with a refractive index of 2.3 at a wavelength of 550 nm and of the geometric thickness of a metal conduction layer of Ag.

Figure 6:
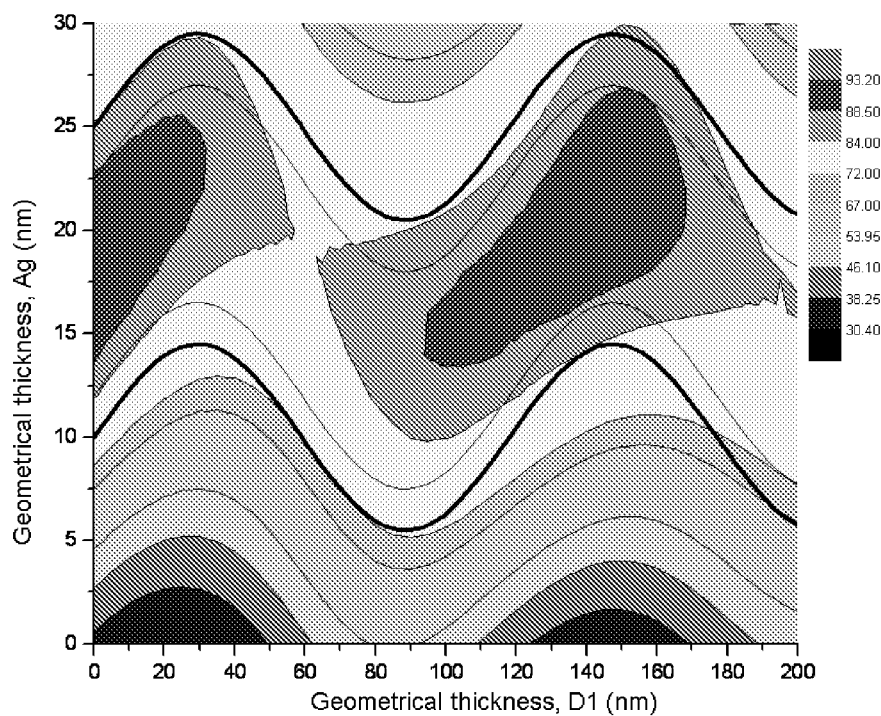

FIG. 6 shows the evolution of the luminance of an organic light-emitting device emitting a quasi-white light and comprising a substrate without the scattering layer and having a transparent support with a refractive index of 1.5 at a wavelength equal to 550 nm as a function of the geometric thickness of the coating for improving the light transmission with a refractive index of 2.3 at a wavelength of 550 nm and of the geometric thickness of a metal conduction layer of Ag.

Figure 7:
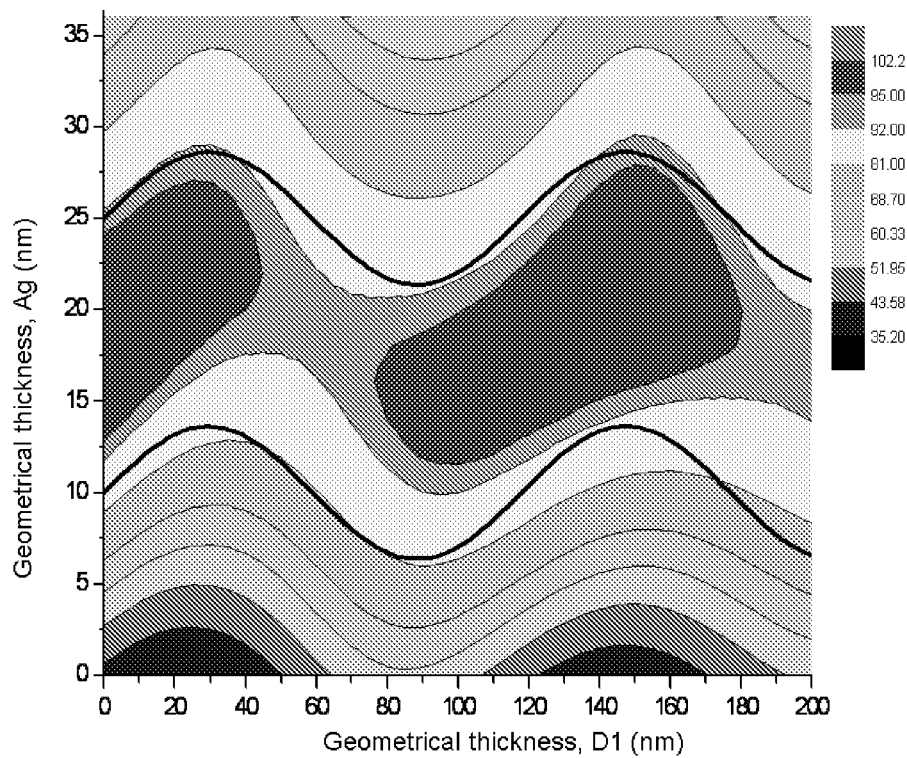

FIG. 7 shows the evolution of the luminance of an organic light-emitting device emitting a quasi-white light and comprising a substrate without the scattering layer and having a transparent support with a refractive index of 1.6 at a wavelength equal to 550 nm as a function of the geometric thickness of the coating for improving the light transmission with a refractive index of 2.3 at a wavelength of 550 nm and of the geometric thickness of a metal conduction layer of Ag.

Figure 8:
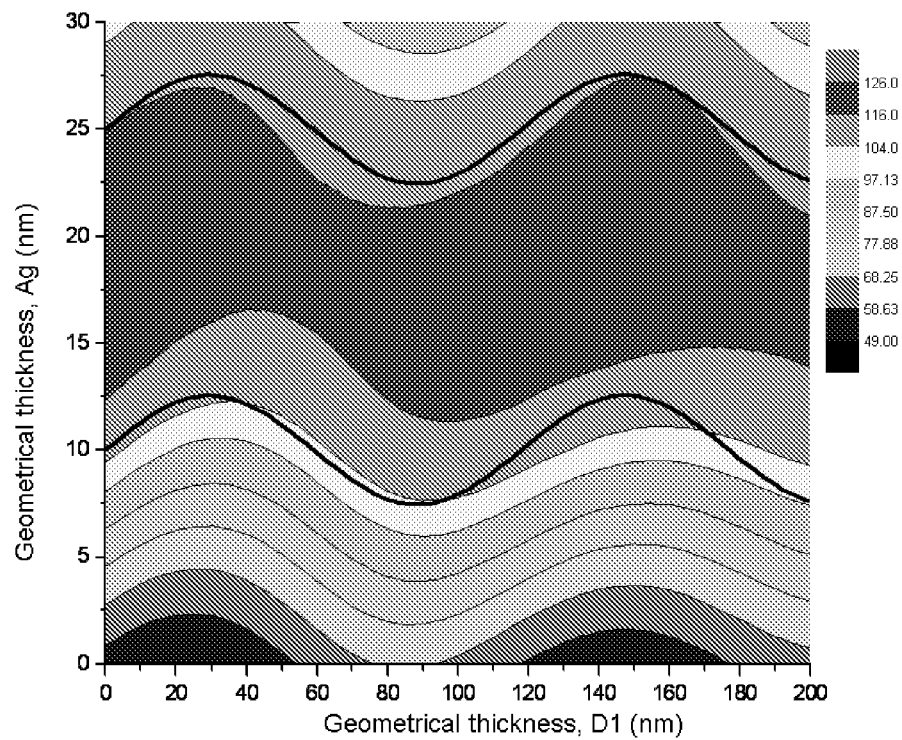

FIG. 8 shows the evolution of the luminance of an organic light-emitting device emitting a quasi-white light and comprising a substrate without the scattering layer and having a transparent support with a refractive index of 1.8 at a wavelength equal to 550 nm as a function of the geometric thickness of the coating for improving the light transmission with a refractive index of 2.3 at a wavelength of 550 nm and of the geometric thickness of a metal conduction layer of Ag.

Figure 9:
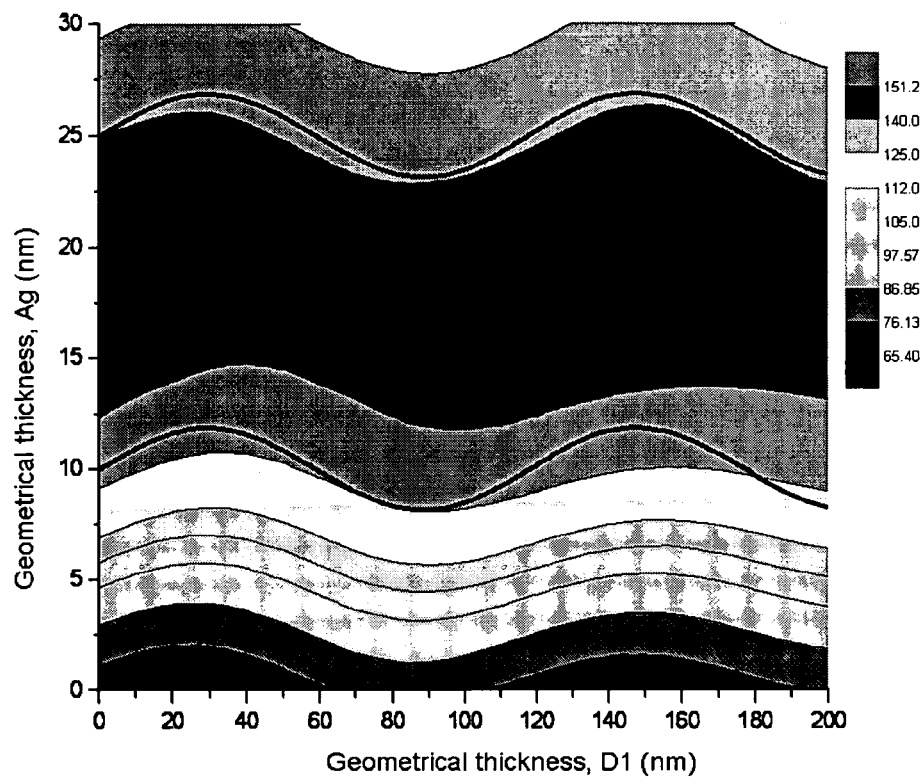

FIG. 9 shows the evolution of the luminance of an organic light-emitting device emitting a quasi-white light and comprising a substrate without the scattering layer and having a transparent support with a refractive index of 2.0 at a wavelength equal to 550 nm as a function of the geometric thickness of the coating for improving the light transmission with a refractive index of 2.3 at a wavelength of 550 nm and of the geometric thickness of a metal conduction layer of Ag.

Figure 10:
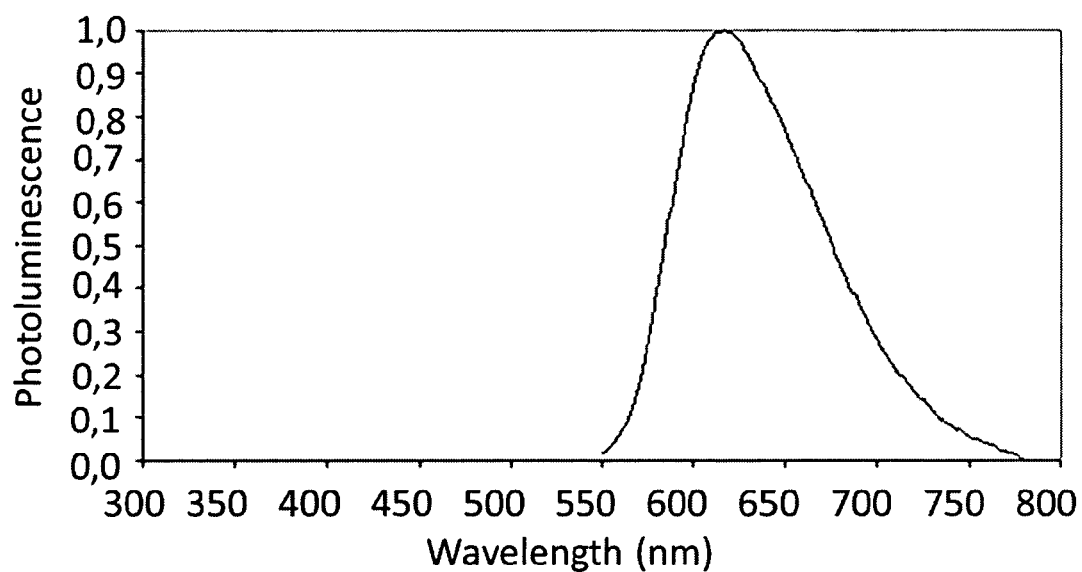

FIG. 10 shows the photoluminescence as a function of the wavelength spectrum of a monochromic radiation, the main wavelength of which lies in the red light range.

Figure 11:
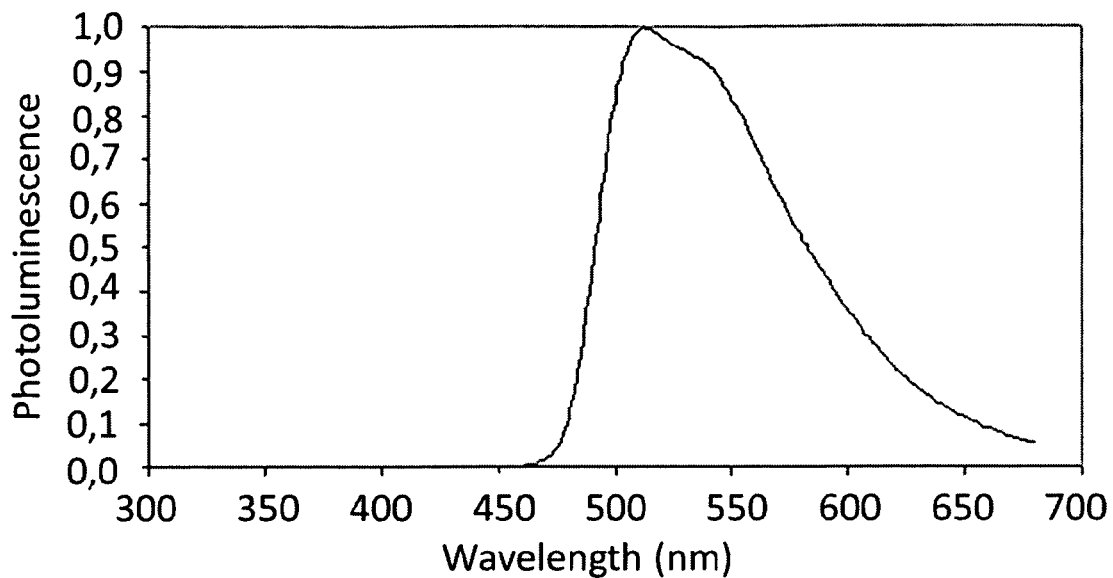

FIG. 11 shows the photoluminescence as a function of the wavelength spectrum of a monochromic radiation, the main wavelength of which lies in the green light range.

Figure 12:
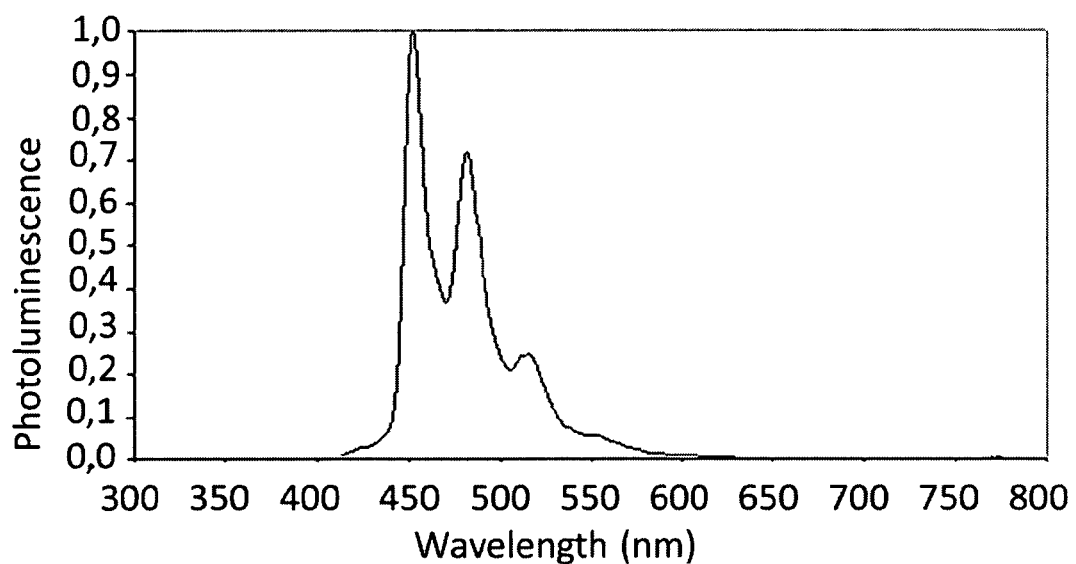

FIG. 12 shows the photoluminescence as a function of the wavelength spectrum of a monochromic radiation, the main wavelength of which lies in the blue light range.

Figure 13:
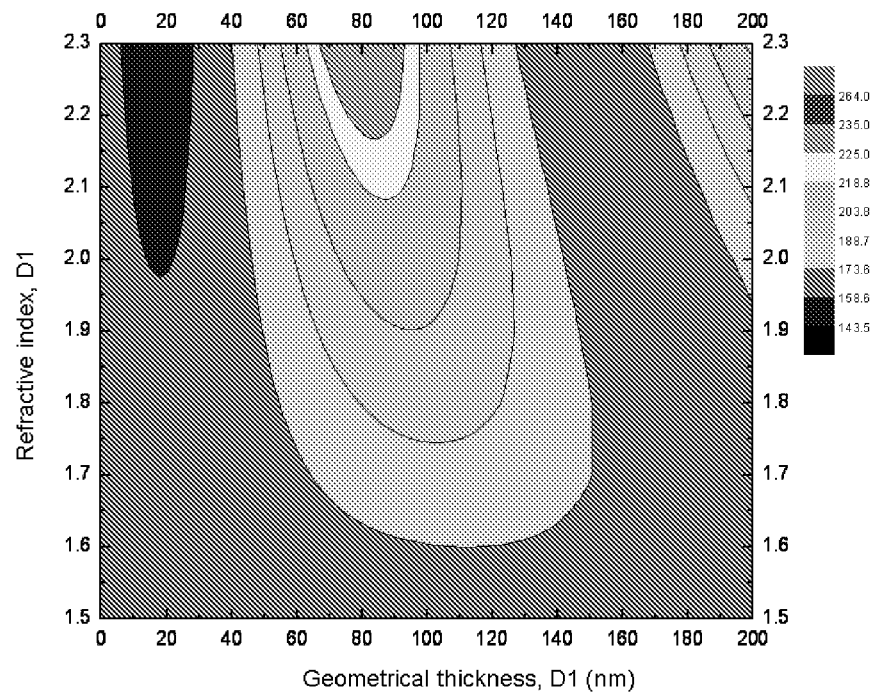

FIG. 13 shows the evolution of the luminance of the organic light-emitting device comprising a substrate without the scattering layer and having a transparent support, as a function of the geometric thickness and the refractive index of the layer for improving light transmission of the electrode according to the invention for a red light, wherein a metal conduction layer of Ag has a geometric thickness equal to 12.5 nm and a support has a refractive index of 1.5.

Figure 14:
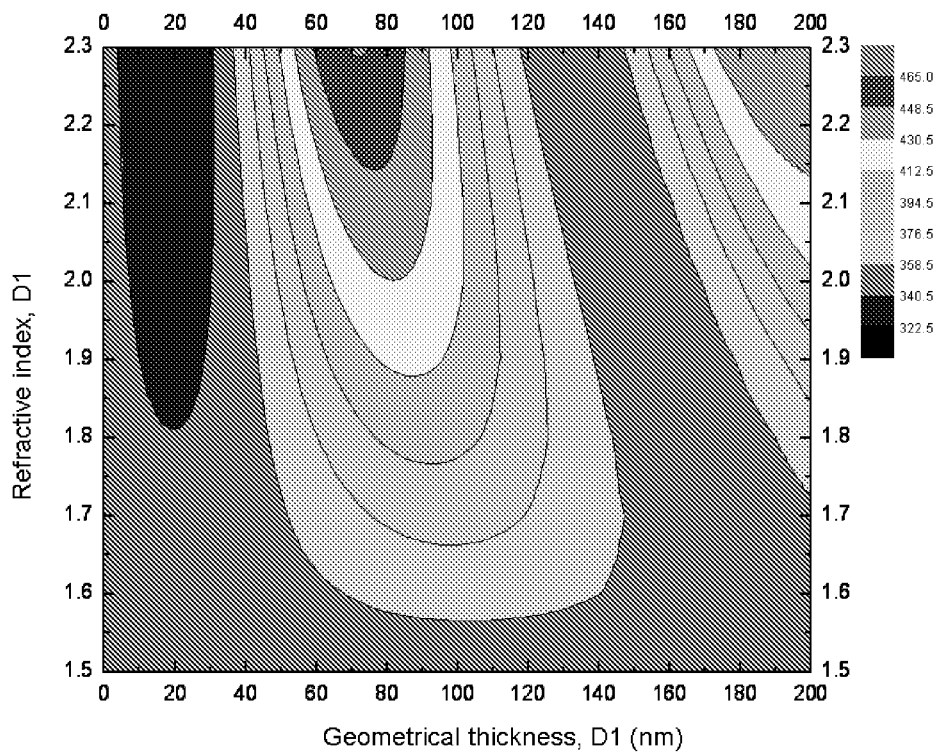

FIG. 14 shows the evolution of the luminance of the organic light-emitting device comprising a substrate without the scattering layer and having a transparent support, as a function of the geometric thickness and the refractive index of the layer for improving light transmission of the electrode according to the invention for a green light, wherein a metal conduction layer of Ag has a geometric thickness equal to 12.5 nm and a support has a refractive index of 1.5.

Figure 15:
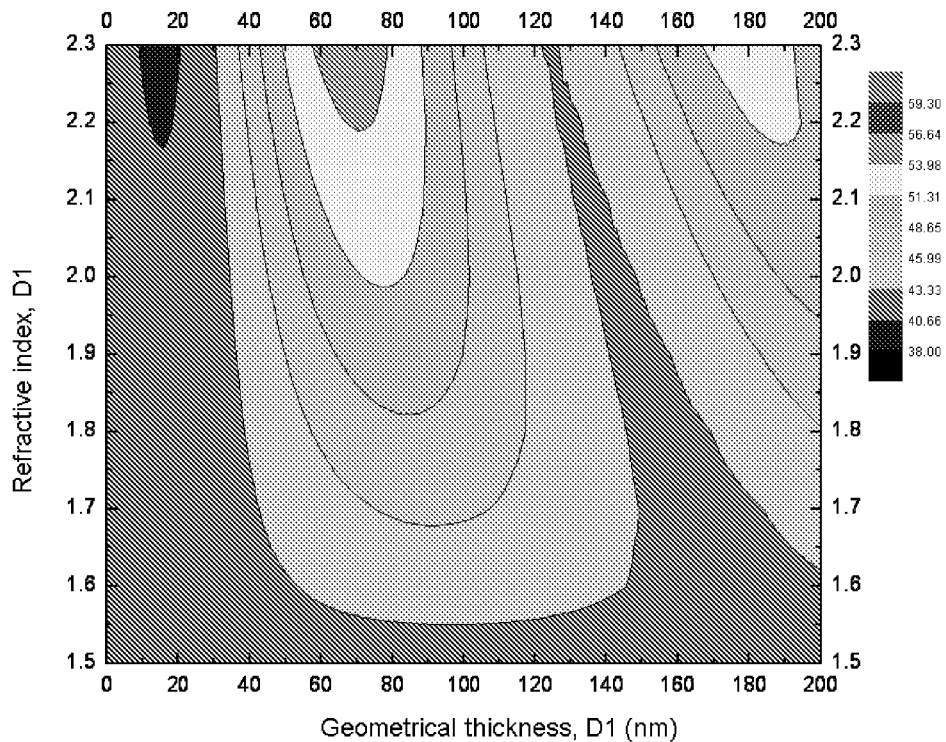

FIG. 15 shows the evolution of the luminance of the organic light-emitting device comprising a substrate without the scattering layer and having a transparent support, as a function of the geometric thickness and the refractive index of the layer for improving light transmission of the electrode according to the invention for a blue light, wherein a metal conduction layer of Ag has a geometric thickness equal to 12.5 nm and a support has a refractive index of 1.5.

Figure 16:
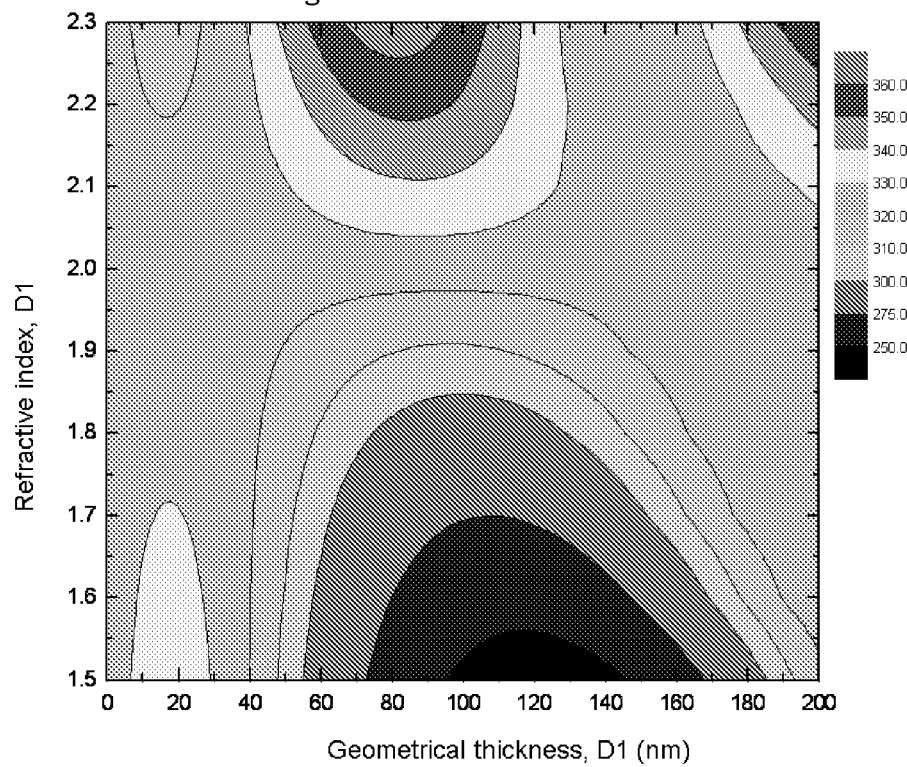

FIG. 16 shows the evolution of the luminance of the organic light-emitting device comprising a substrate without the scattering layer and having a transparent support, as a function of the geometric thickness and the refractive index of the layer for improving transmission of the electrode according to the invention for a red light, wherein a metal conduction layer of Ag has a geometric thickness equal to 12.5 nm and a support has a refractive index of 2.0.

Figure 17:
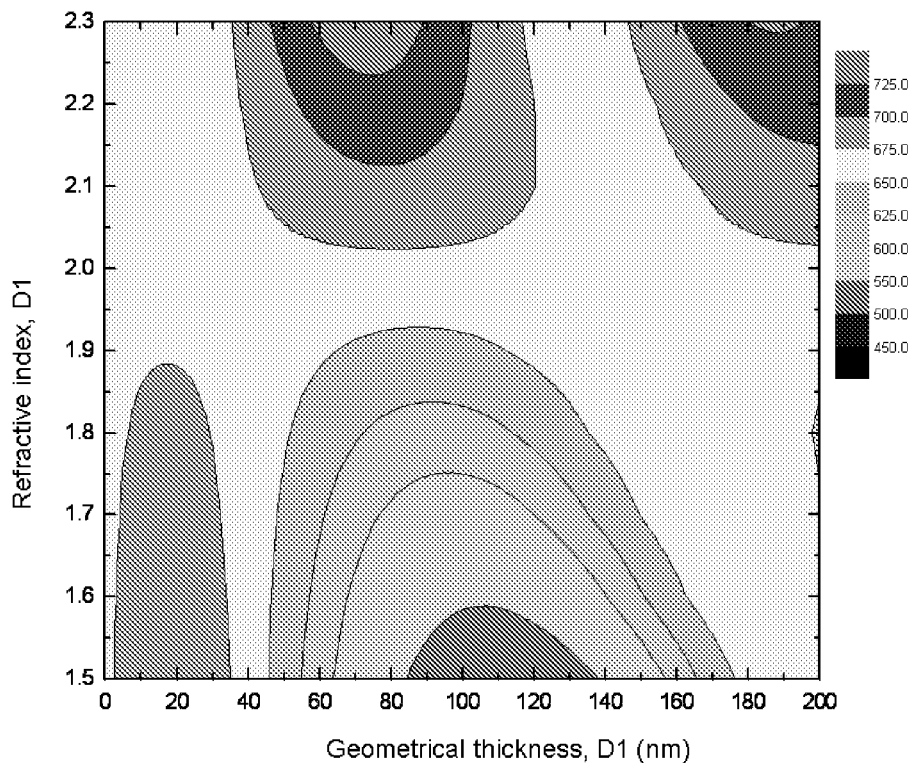

FIG. 17 shows the evolution of the luminance of the organic light-emitting device comprising a substrate without the scattering layer and having a transparent support, as a function of the geometric thickness and the refractive index of the layer for improving light transmission of the electrode according to the invention for a green light, wherein a metal conduction layer of Ag has a geometric thickness equal to 12.5 nm and a support has a refractive index of 2.0.

Figure 18:
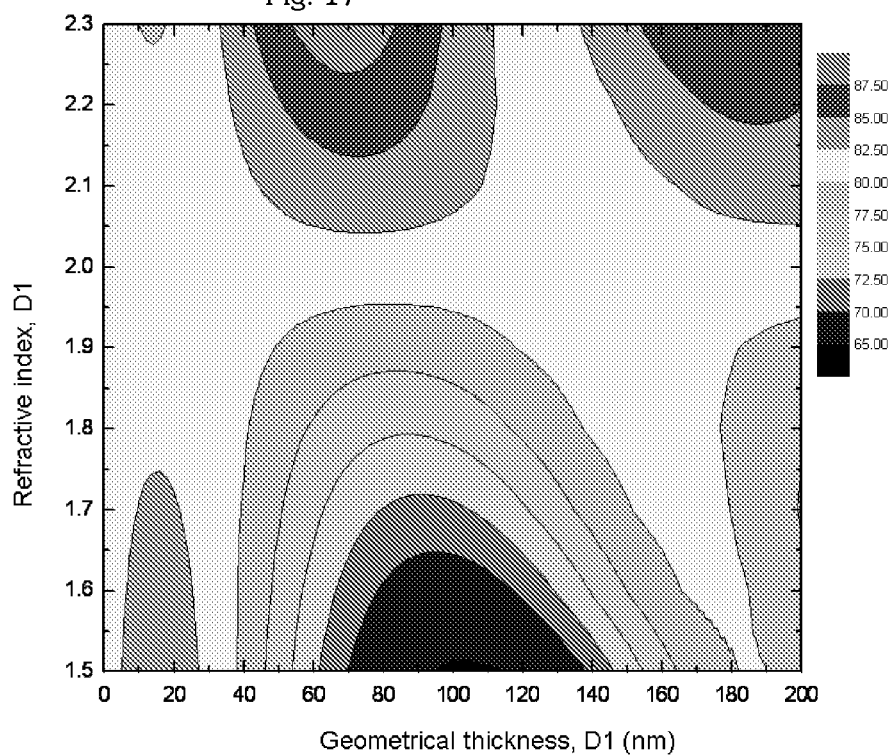

FIG. 18 shows the evolution of the luminance of the organic light-emitting device comprising a substrate without the scattering layer and having a transparent support, as a function of the geometric thickness and the refractive index of the layer for improving light transmission of the electrode according to the invention for a blue light, wherein a metal conduction layer of Ag has a geometric thickness equal to 12.5 nm and a support has a refractive index of 2.0.

Figure 19:
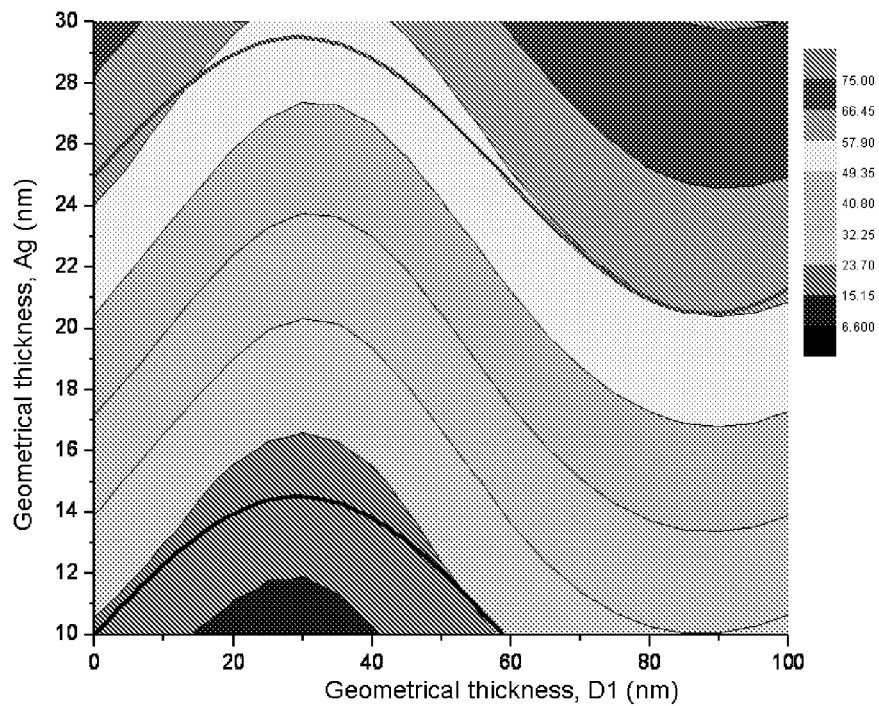

FIG. 19 shows the evolution of the simulated reflection, expressed in D65 at 2° in accordance with European standard EN 410, of a substrate without the scattering layer and having a transparent support, said support having a refractive index equal to 1.5 at a wavelength equal to 550 nm, as a function of the geometric thickness of the coating for improving light transmission and of the geometric thickness of the metal conduction layer of Ag, wherein above the conduction layer the substrate also comprises a sacrificial layer of $TiO_x$ that has a geometric thickness equal to 3.0 nm and an insertion layer of $Zn_xSn_yO_z$ (where x+y≥3 and z≤6) that has a geometric thickness equal to 14.7 nm, wherein the insertion layer is coated with an organic medium with a refractive index equal to 1.7 at a wavelength of 550 nm.

Figure 20:
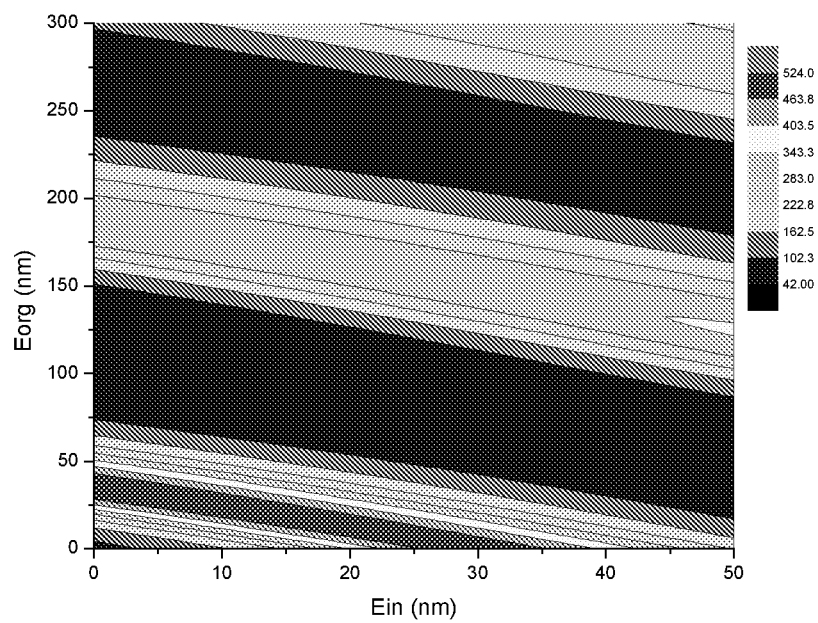

FIG. 20 shows the evolution of the luminance of the organic light-emitting device incorporating a substrate without the scattering layer and having a transparent support, said support having a refractive index of 1.5 at a wavelength of 550 nm and a metal conduction layer with a geometric thickness of 12.5 nm as a function of the geometric thicknesses of the insertion layer ($E_{in}$) and the first organic layer of the electrode for a green light.

Figure 21:
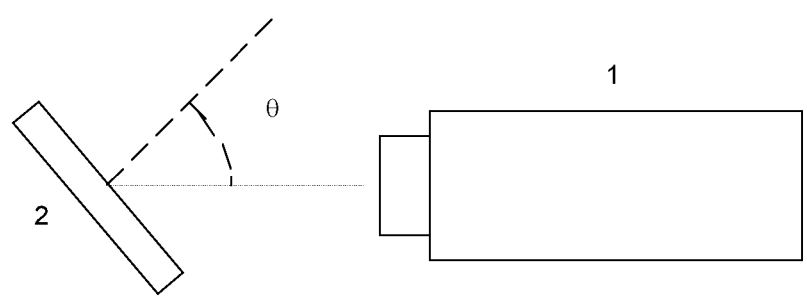

FIG. 21 shows a measurement device for measuring the light emitting luminance and the angular dependency light-emitting colour.

Figure 1:
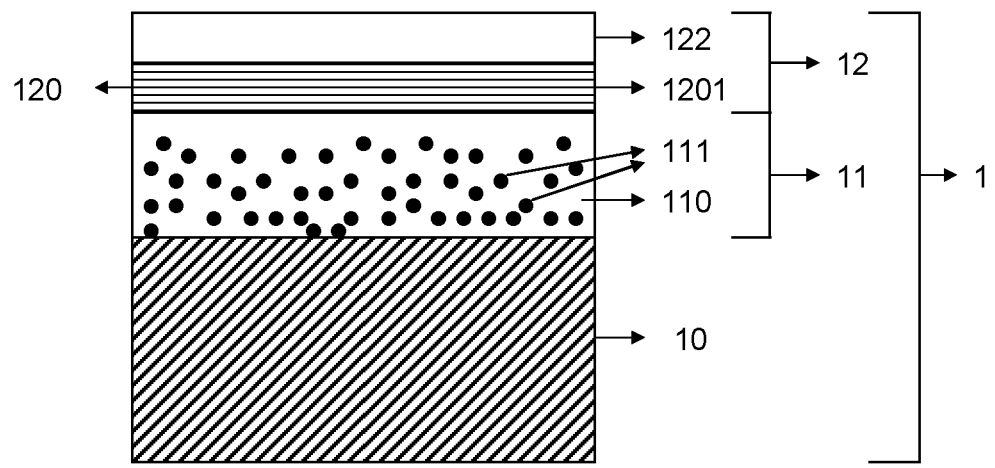
FIG. 1 shows a cross-sectional view of a translucent conductive substrate according to the invention, wherein the substrate comprises a support, a scattering layer and an electrode formed from a stacking structure consisting of a minimum number of layers.

FIG. 1 shows an example of stacking structure forming a translucent conductive substrate according to the invention. The translucent conductive substrate (1) has the following structure, starting from the transparent support (10):
 a scattering layer (11) formed over the transparent support (10) and comprising a glass which contains a base material (110) having a first refractive index for at least one wavelength of light to be transmitted and a plurality of scattering materials (111) dispersed in the base material (110) and having a second refractive index different from that of the base material,
 an electrode (12) constituted by:
  a coating for improving light transmission (120) comprising a layer for improving light transmission (1201),
  a metal conduction layer (122)

Figure 2:
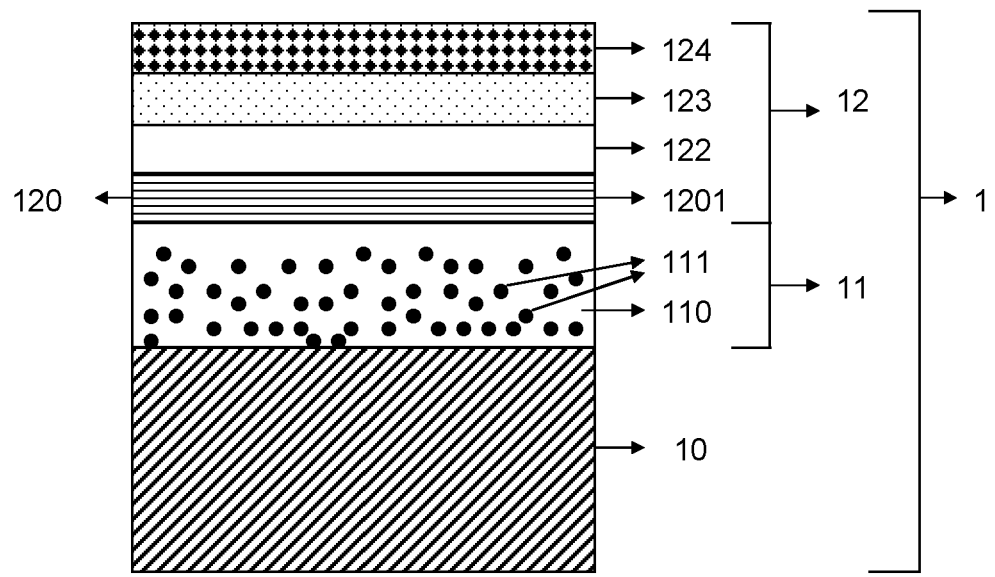
FIG. 2 shows a cross-sectional view of a translucent conductive substrate according to the invention in a second embodiment.

FIG. 2 shows an alternative example of the translucent conductive substrate according to the invention. This comprises, in addition to the layers already present in FIG. 1 constituting the electrode (12), an insertion layer (123) and a layer for homogenizing surface electrical properties (124). The translucent conductive substrate has the following structure, starting from the support (10):
 a scattering layer (11) formed over the transparent support (10) and comprising a glass which contains a base material (110) having a first refractive index for at least one wavelength of light to be transmitted and a plurality of scattering materials (111) dispersed in the base material (110) and having a second refractive index different from that of the base material,
 an electrode (12) constituted by:
  a coating for improving light transmission (120) comprising a layer for improving light transmission (1201)
  a metal conduction layer (122)
  an insertion coating (123)
  a homogenisation coating (124)

Figure 3:
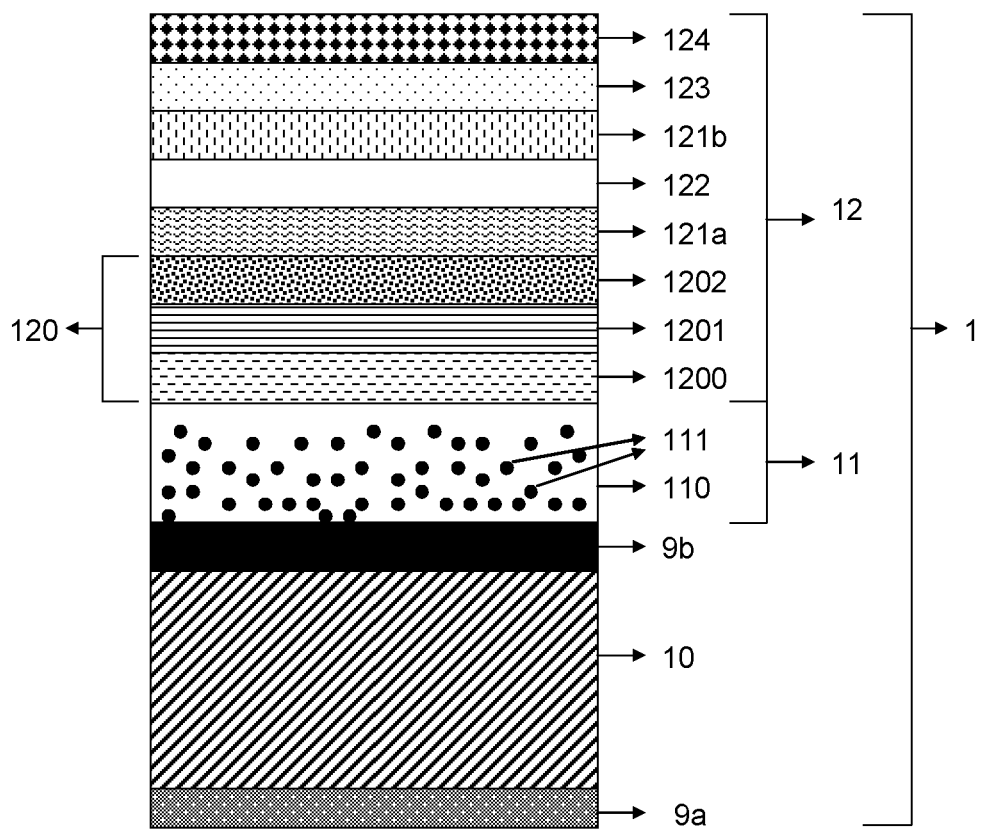
FIG. 3 shows a cross-sectional view of a translucent conductive substrate according to the invention, wherein the substrate comprises a support having a barrier layer, a scattering layer and an electrode formed from a stacking structure consisting of a minimum number of layers and with a different function.

FIG. 3 shows another translucent substrate according to the invention. This comprises, in addition to the layers already present in FIG. 2 constituting the electrode, an additional barrier layer (1200) and an additional crystallisation layer (1202) belonging to the coating for improving light transmission (120), two sacrificial layers (121a, 121b). Furthermore, the translucent conductive substrate according to the invention comprises also a barrier layer (9b) located between the support (10) and the scattering layer (11) and a functional coating (9a) on the second face of the transparent support (10). The translucent conductive substrate has the following structure, starting from the second face of the support (10):
 a functional coating (9a)
 a transparent support (10)
 a barrier layer on the support (9b)
 a scattering layer (11) formed over the transparent support (10) and comprising a glass which contains a base material (110) having a first refractive index for at least one wavelength of light to be transmitted and a plurality of scattering materials (111) dispersed in the base material (110) and having a second refractive index different from that of the base material,
 an electrode (12) constituted by:
  a coating for improving light transmission (120) comprising:
   a barrier layer (1200)
   a layer for improving light transmission (1201)
   a crystallisation layer (1202)
  a sacrificial layer (121a)
  a metal conduction layer (122)
  a sacrificial layer (121b)
  an insertion layer (123)
  a homogenisation layer (124)

Figure 4:
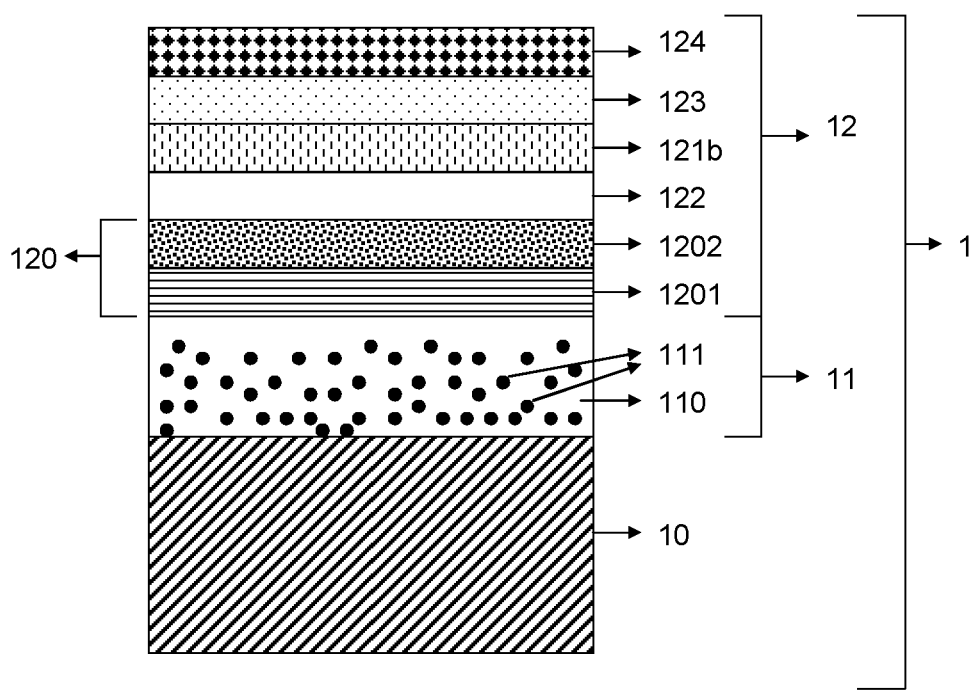
FIG. 4 shows a cross-sectional view of the translucent conductive substrate according to the invention in a preferred embodiment.

FIG. 4 shows another example of a translucent substrate according to the invention. The substrate has the following structure, starting from the support (10):
 a scattering layer (11) formed over the transparent support (10) and comprising a glass which contains a base material (110) having a first refractive index for at least one wavelength of light to be transmitted and a plurality of scattering materials (111) dispersed in the base material (110) and having a second refractive index different from that of the base material,
 an electrode (12) constituted by:
  a coating for improving light transmission (120) comprising:
   a layer for improving light transmission (1201)
   a crystallisation layer (1202)
  a sacrificial layer (121a)
  a metal conduction layer (122)
  a sacrificial layer (121b)
  an insertion layer (123)
  a homogenisation layer (124)

FIGS. 5, 6, 7, 8 and 9 show the evolution of the luminance of an organic light-emitting device emitting a quasi-white light as a function of the geometric thickness of the coating for improving the light transmission (D1) with a refractive index of 2.3 ($n_{D1}$) at a wavelength of 550 nm, and of the geometric thickness of a metal conduction layer of Ag and comprising a support with a refractive index equal to 1.4, 1.5, 1.6, 1.8 and 2.0 respectively at a wavelength equal to 550 nm. The structure of the organic light-emitting device comprises the following stacking structure:
 support (10) having a geometric thickness equal to 100.0 nm
 electrode (12):
  coating for improving the light transmission (120),
  metal conduction layer made of Ag (122),
 the organic portion of the organic light-emitting device is such that it has the following structure:
  a hole transporting layer, HTL, having a geometric thickness equal to 25.0 nm,
  an electron blocking layer, EBL, having a geometric thickness equal to 10.0 nm,
  an emissive layer emitting a Gaussian spectrum of white light corresponding to illuminant A and having a geometric thickness equal to 16.0 nm,
  a hole blocking layer, HBL, having a geometric thickness equal to 10.0 nm, an electron transporting layer, ETL, having a geometric thickness equal to 43.0 nm.

a counter-electrode made of Al having a thickness equal to 100.0 nm.

These calculations show that a maximum luminance is obtained for a substrate without scattering layer such that the geometric thickness of the coating having properties for improving light transmission (120), $T_{D1}$, and the geometric thickness of the metal conduction layer (122), $T_{ME}$, are linked by the following equation:

$$T_{ME}=T_{ME\_0}+[B*\sin(\pi*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9*n_{D1}$ to $28.3*n_{D1}$ nm, with $n_{D1}$ representing the refractive index of the coating for improving the light transmission at a wavelength of 550 nm and $n_{support}$ represents the refractive index of the support at a wavelength of 550 nm. The luminance was calculated using the program SETFOS, version 3 (Semiconductive Emissive Thin Film Optics Simulator) from Fluxim. This luminance is expressed as arbitrary unit. The sine curves appearing in the form of thicker lines indicate extreme values in the area selected by the equation $T_{ME}=T_{ME\_0}+[B*\sin(\pi*T_{D1}/T_{ME\_0})]/(n_{support})^3$. The inventors have found surprisingly that the area selected is not only valid for an organic device emitting quasi-white light but also for any type of colour emitted (e.g. red, green, blue). Moreover, the inventors have surprisingly found that the area selected by the equation $T_{ME}=T_{ME\_0}+[B*\sin \pi*T_{D1}/T_{D1\_0})]/(n_{support})^3$ for a substrate without scattering layer could also be used for a translucent conductive substrate according to the invention comprising a scattering layer located between the support and the electrode.

The inventors have found that, with the same structure of substrate without scattering layer (11), the use of a support (10) with a high refractive index enables the amount of light emitted by the OLED to be increased. A high refractive index is understood to be a refractive index at least equal to 1.4, preferably at least equal to 1.5, more preferred at least equal to 1.6, most preferred at least equal to 1.7. In fact, as comparison of FIGS. 5 and 9 shows, an increase in the order of 180% in the luminance of the OLED is observed when, with the same structure of substrate without scattering layer, a support with a refractive index equal to 2.0 is used instead of a support with a refractive index equal to 1.4, wherein the refractive index of the support is the refractive index at a wavelength of 550 nm. The same evolution is also observed for the translucent conductive substrate according to the invention.

FIGS. 10 to 19, more particularly FIGS. 13 to 19, relate to an example of a substrate without scattering layer that corresponds to a conduction layer of Ag having a geometric thickness equal to 12.5 nm. In these figures, the substrate without scattering layer is incorporated into an OLED emitting a red, green or blue colour. The structure of the organic light-emitting device comprises the following stacking structure:

support (10) having a geometric thickness equal to 100.0 nm electrode (12):
coating for improving the light transmission (120),
metal conduction layer made of Ag (122), the organic portion of the organic light-emitting device is such that it has the following structure:
a hole transporting layer, HTL, having a geometric thickness equal to 25.0 nm, an electron blocking layer, EBL, having a geometric thickness equal to 10.0 nm, an emissive layer causing emission of a spectrum of red, green or blue light, of which the (x, y) chromatic coordinates are respectively equal to coordinates (0.63, 0.36), (0.24, 0.68) or (0.13, 0.31) in the CIE 1931 colorimetric diagram, according to which the device is provided for the emission of red, green or blue light, and having a geometric thickness equal to 16.0 nm, a hole blocking layer, HBL, having a geometric thickness equal to 10.0 nm, an electron transporting layer, ETL, having a geometric thickness equal to 43.0 nm.

a counter-electrode made of Al having a thickness equal to 100.0 nm.

FIGS. 10, 11 and 12 respectively show the evolution of the photoluminescence as a function of the wavelength spectra of a monochromic radiation, the main wavelength of which lies in the red, green or blue light range. Main wavelength is understood to mean the wavelength at which the photoluminescence is at its maximum. The term "monochromic" is understood to mean that a single colour is perceived by the eye without this light being monochromatic as such. Photoluminescence is expressed in the form of the relation between the value of the photoluminescence at a wavelength divided by the value of maximum photoluminescence. Therefore, the photoluminescence is a number without unit in the range of between 0 and 1. These figures clearly show that the light emitted by the OLED cannot be simply limited to a single wavelength. FIG. 10 shows that at a wavelength equal to 616 nm, the photoluminescence is at maximum in the case of monochromic radiation, the main wavelength of which lies in the red colour range. FIG. 11 shows that at a wavelength equal to 512 nm, the photoluminescence is at maximum in the case of monochromic radiation, the main wavelength of which lies in the green colour range. FIG. 12 shows that at a wavelength equal to 453 nm, the photoluminescence is at maximum in the case of monochromic radiation, the main wavelength of which lies in the blue colour range.

FIGS. 13, 14 and 15 show the development of the luminance of the organic light-emitting device as a function of the geometric thickness (D1) and the refractive index of the coating for improving the light transmission ($n_{D1}$) (120) of the substrate without scattering layer, respectively for a red, green and blue light colour, and for a support having a refractive index of 1.5 at a wavelength of 550 nm, wherein the geometric thickness of a metal conduction layer of Ag is equal to 12.5 nm. This calculation was conducted not by taking into account a luminous radiation limited to a single wavelength, but by taking into account the real spectrum of wavelengths, as shown in FIGS. 10, 11 and 12. Surprisingly, these calculations show that a maximum luminance is obtained for a translucent conductive substrate without scattering layer that is such that the geometric thickness of the coating having properties for improving light transmission (120), $T_{D1}$, and the geometric thickness of the metal conduction layer (122), $T_{ME}$, are linked by the following equation:

$$T_{ME}=T_{ME\_0}+[B*\sin(\pi*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9*n_{D1}$ to $28.3*n_{D1}$ nm, with $n_{D1}$ representing the refractive index of the coating for improving the light transmission at a wavelength of 550 nm and $n_{support}$ represents the refractive index of the support at a wavelength of 550 nm. The luminance was calculated using the program SETFOS, version 3 (Semiconductive Emissive Thin Film Optics Simulator) from Fluxim.

For the special case outlined above, the substrate without scattering layer having a support with a refractive index equal to 1.5 at a wavelength of 550 nm and a conduction layer of Ag with a geometric thickness equal to 12.5 nm, it is evident on the basis of FIGS. 13, 14, 15, obtained for an OLED emitting a red, green and blue light respectively, that a high luminance is obtained more particularly when the geometric thickness of the coating for improving light transmission is at least equal to 50.0 nm, preferably at least equal to 60.0 nm, more preferred at least equal to 70.0 nm and at most equal to 110.0 nm, preferably at most equal to 100.0 nm, more preferred at most equal to 90.0 nm, most preferred at most equal to 80.0 nm. Moreover, on the basis of FIG. 6, which describes the evolution of the luminance of an organic light-emitting device emitting a quasi-white light and having a support with a refractive index of 1.5 at a wavelength equal to 550 nm as a function of the geometric thickness of the coating for improving light transmission having a refractive index of 2.3 at a wavelength of 550 nm, and of the geometric thickness of a metal conduction layer made of Ag, it is evident that, for a substrate with a thickness of metal conduction layer of Ag of 12.5 nm, the optimum geometric thickness of the coating for improving light transmission must be in the range of between 50.0 nm and 130.0 nm. The same observation is done with a translucent conductive substrate according to the invention.

FIGS. 16, 17 and 18 show the evolution of the luminance of the organic light-emitting device as a function of the geometric thickness (D1) and the refractive index of the coating for improving the light transmission ($n_{D1}$) (120) of the substrate without a scattering layer, respectively for a red, green and blue light colour, and for a support having a refractive index of 2.0 at a wavelength of 550 nm, wherein the geometric thickness of a metal conduction layer of Ag is equal to 12.5 nm. This calculation was conducted not by taking into account a luminous radiation limited to a single wavelength, but by taking into account the real spectrum of wavelengths, as shown in FIGS. 10, 11 and 12. Surprisingly, these calculations also show that a maximum luminance is obtained for a translucent conductive substrate without scattering layer which is such that the geometric thickness of the coating having properties for improving light transmission (120), $T_{D1}$, and the geometric thickness of the metal conduction layer (122), $T_{ME}$, are linked by the following equation:

$$T_{ME}=T_{ME\_0}+[B^*\sin(\pi^*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9^*n_{D1}$ to $28.3^*n_{D1}$ nm, with $n_{D1}$ representing the refractive index of the coating for improving the light transmission at a wavelength of 550 nm and $n_{support}$ represents the refractive index of the support at a wavelength of 550 nm. The luminance was calculated using the program SETFOS, version 3 (Semiconductive Emissive Thin Film Optics Simulator) from Fluxim.

For the special case outlined above, it is evident on the basis of FIGS. 16, 17, 18, obtained for an OLED emitting a red, green and blue light respectively, that a high luminance is obtained more particularly when the geometric thickness of the coating for improving light transmission is at least equal to 40.0 nm, preferably at least equal to 50.0 nm, more preferred at least equal to 60.0 nm and at most equal to 110.0 nm, preferably at most equal to 100.0 nm, more preferred at most equal to 90.0 nm. Therefore, the geometric thickness of the coating for improving light transmission is advantageously comprised within the range of two of the preceding values, preferably comprised within the range from 40.0 nm to 110.0 nm, more preferably from 50.0 nm to 100.0 nm, the most preferably from 60.0 nm to 90.0 nm. Moreover, on the basis of FIG. 9, which describes the development of the luminance of an organic light-emitting device emitting a quasi-white light and having a support with a refractive index of 2.0 at a wavelength equal to 550 nm as a function of the geometric thickness of the coating for improving light transmission having a refractive index of 2.3 at a wavelength of 550 nm, and of the geometric thickness of a metal conduction layer made of Ag, it is evident that, for a substrate with a thickness of metal conduction layer of Ag of 12.5 nm, the optimum geometric thickness of the coating for improving light transmission must be at least greater than 3.0 nm and at most equal to 200.0 nm. The same observation is done with a translucent conductive substrate according to the invention.

FIGS. 13 to 18 all show that with the same substrate structure in the case of a fixed refractive index of the support, a more significant luminance is obtained when the refractive index of the coating for improving light transmission (110) is higher than the refractive index of the support (10), particularly when $n_{D1}>1.2^*n_{support}$, more particularly when $n_{D1}>1.3^*n_{support}$, most particularly when $n_{D1}>1.5^*n_{support}$. The refractive index of the material forming the coating ($n_{D1}$) has a value ranging from 1.5 to 2.4, preferably ranging from 2.0 to 2.4, more preferred ranging from 2.1 to 2.4, at a wavelength of 550 nm. The same observation is done with a translucent conductive substrate according to the invention.

Surprisingly, the inventors have found that the optimum thickness of the improvement coating to obtain a maximum luminance, in other words a high emission level, depends little on the wavelength spectrum of the monochromic radiation (blue, green or red light), as demonstrated in FIGS. 13 to 18. More surprisingly, this optimum lies in the same range of geometric thickness of the improvement coating (120). For example, in the case of a material with a refractive index ranging from 2.0 to 2.3, the geometric thickness of the improvement coating that enables an optimum emission at different wavelengths has a value ranging from 45.0 to 95.0 nm. This range is centred on and around a geometric thickness value of 70.0 nm. Moreover, respective comparisons of FIGS. 8 and 11 for red light, FIGS. 9 and 12 for green light and FIGS. 10 and 13 for blue light show that the refractive index of the support has little influence on the optimum thickness range of the improvement coating. The same observation is done with a translucent conductive substrate according to the invention.

The inventors have found that in addition to providing a high emission level, the use of a substrate which comprises a transparent support and an electrode is such that the optical thickness of the coating having properties for improving light transmission (120), $T_{D1}$, and the geometric thickness of the metal conduction layer (122), $T_{ME}$, are linked by the following equation $T_{ME}=T_{ME\_0}+[B^*\sin(\pi^*T_{D1}/T_{D1\_0})]/(n_{support})^3$ allows a quasi-white light to be provided when sources of red, blue and green light are used at the same time, as FIGS. 5 to 9 show. More particularly, as FIGS. 13 to 15 show, when the substrate which comprises a transparent support and an electrode according to the relation $T_{ME}=T_{ME\_0}+[B^*\sin(\pi T_{D1}/T_{D1\_0})]/(\pi_{support})^3$, is such that it is formed by a support with a refractive index equal to 1.5 at a wavelength of 550 nm and with a conduction layer of Ag with a geometric thickness equal to 12.5 nm, the inventors have been able to determine that for every material with a refractive index within the range of values from 2.0 to 2.3, the optimum geometric thickness of the improvement coating (120) with a value ranging from 45 to 95 nm surprisingly allows a quasi-white light to be obtained. The quasi-white light is preferably obtained with a geometric thickness ranging from 60.0 to 80.0 nm, more preferred from 65.0 to 75.0 nm. Thus, the simultaneous use of three light sources that emit spectra of colorimetric coordinates (0.63, 0.36) for the red light source, (0.26, 0.68) for the green light source and (0.13, 0.31) for the blue light source allows a quasi-white light to be obtained, i.e. for a coating improving light transmission with a geometric thickness of 70.0 nm and a refractive index of 2.3. The same observation is done with a translucent conductive substrate according to the invention.

On the basis of FIGS. 5 to 7 the inventors have surprisingly found that two particular areas can be selected in the structures of substrates which comprise a transparent support and an electrode such as $T_{ME} = T_{ME\_0} + [B^* \sin(\pi^* T_{D1}/T_{D1\_0})]/(n_{support})^3$, intended for incorporation into an organic light-emitting device.

The first area of selection relates to substrates, wherein the support has a refractive index equal to 1.5 at a wavelength of 550 nm and the geometric thickness of the metal conduction layer is at least equal to 6.0 nm, preferably at least equal to 8.0 nm, more preferred at least equal to 10.0 nm and at most equal to 22.0 nm, preferably at most equal to 20.0 nm, more preferred at most equal to 18.0 nm, the geometric thickness of the metal conduction layer is advantageously comprised within the range of two of the preceding values, preferably within the range from 6.0 nm to 22.0 nm, more preferably from 8.0 nm to 18.0 nm, the most preferably from 10.0 nm to 18.0 nm, and wherein the geometric thickness of the coating for improving light transmission is at least equal to 50.0 nm, preferably at least equal to 60.0 nm and at most equal to 130.0 nm, preferably at most equal to 110.0 nm, more preferred at most equal to 90.0 nm, the geometric thickness of the coating for improving light transmission is advantageously comprised within the range of two of the preceding values, preferably within the range from 50.0 nm to 110.0 nm, more preferably from 60.0 nm to 90.0 nm. This structure has the triple advantage of using a low-cost soda-lime-silica glass support, of using finer metal conduction layers (e.g. of Ag) combined with greater thicknesses of the coating for improving light transmission, and such thicknesses allow a better protection of the metal conduction layer against possible contamination by the migration of alkaline substances coming from the soda-lime-silica glass support.

The second area of selection concerns substrates with a support with a refractive index value in the range of 1.4 to 1.6, wherein the geometric thickness of the metal conduction layer is at least equal to 16.0 nm, preferably at least equal to 18.0 nm, more preferred at least equal to 20.0 nm and at most equal to 29.0 nm, preferably at most equal to 27.0 nm, more preferred at most equal to 25.0 nm, the geometric thickness of the metal conduction layer is advantageously comprised within the range of two of the preceding values, preferably from 16.0 nm to 29.0 nm, more preferably from 18.0 nm to 27.0 nm, the most preferably 20.0 nm to 25.0 nm, and wherein the geometric thickness of the coating for improving light transmission is at least equal to 20.0 nm and at most equal to 40.0 nm. This structure has the advantage of using thicker metal conduction layers (e.g. of silver), the use of a thick metal conduction layer enabling better conduction to be achieved.

The inventors have surprisingly found that the same observation is also done with the translucent conductive substrate according to the invention.

FIG. 19 shows the development of the simulated reflection, expressed in D65 at 2° in accordance with European standard EN 410, of a substrate comprising a support having a refractive index equal to 1.5 at a wavelength equal to 550 nm as a function of the geometric thickness of the coating for improving light transmission and of the geometric thickness of the metal conduction layer of Ag, wherein above the conduction layer the substrate also comprises a sacrificial layer of $TiO_x$ that has a geometric thickness equal to 3.0 nm and an insertion layer of $Zn_xSn_yO_z$ (where x+y≥3 and z≤6) that has a geometric thickness equal to 14.7 nm, wherein the insertion layer is coated with an organic medium with a refractive index equal to 1.7 at a wavelength of 550 nm. The sine curves appearing in the form of thicker lines indicate extreme values in the area selected by the equation $T_{ME} = T_{ME\_0}[B^* \sin(\pi^* T_{D1}/T_{D1\_0})]/(n_{support})^3$.

FIG. 20 shows the development of the luminance of the organic light-emitting device incorporating a substrate comprising a support with a refractive index of 1.5 at a wavelength of 550 nm and a metal conduction layer having a geometric thickness of 12.5 nm as a function of the geometric thicknesses of the insertion layer ($E_{in}$) and the first organic layer of the electrode ($E_{org}$) for a green light. This calculation was conducted not by taking into account a luminous radiation limited to a single wavelength, but by taking into account the real spectrum of wavelengths, as shown in FIG. 11. The luminance was also calculated using the program SETFOS, version 3. This luminance is expressed as arbitrary unit. The inventors have surprisingly found that two areas characterized by the luminance maxima were observed:

the first area corresponding to the equation: $E_{org} = A - E_{in}$, where A is a constant having a value in the range of 5.0 to 75.0 nm, preferably from 20.0 to 60.0 nm, more preferred from 30.0 to 45.0 nm.

the second area corresponding to the equation: $E_{org} = C - E_{in}$, where C is a constant having a value in the range of 150.0 to 250.0 nm, preferably from 160.0 to 225.0 nm, more preferred from 75.0 to 205.0 nm.

The inventors have found that the equations $E_{org} = A - E_{in}$ or $E_{org} = C - E_{in}$ surprisingly allow the geometric thickness of the first organic layer of the organic light-emitting devices to be used to optimize the optical parameters (geometric thickness and refractive index) of the insertion layer and therefore to optimize the amount of light transmitted while retaining a thickness of the insertion layer that is compatible with the electrical properties that enable high ignition voltages, i.e. respectively for a first and a second luminance maximum, to be avoided.

The translucent conductive substrate according to the invention, its mode of execution as well as the organic light-emitting device containing it will now be characterized on the basis of practical examples described and collated in the following Tables I, II, III, IV, V and VI. These examples are in no way restrictive of the invention.

The organic light-emitting devices that emit a green-coloured monochromic radiation whose performances are shown in Tables I, II, II, IV, VI and VI have the following organic structure, starting from the translucent conductive substrate (1):

a layer of N,N'-bis(1-naphthyl)-N,N'-diphenyl-1,1'-biphenyl-4,4'-diamine, abbreviated to alpha-NPD, a layer of 1,4,7-triazacyclononane-N,N',N''-triacetate (abbreviated to TCTA)+tris[2-(2-pyridinyl)phenyl-C,N]iridium, abbreviated to Ir(ppy)3, a layer of 4,7-diphenyl-1,10-phenanthroline (abbreviated to BPhen), a layer of LiF, an upper reflective electrode composed of at least one metal. According to a preferred embodiment, the metal of the upper reflective electrode consists of at least Ag. According to an alternative embodiment, the metal of the upper reflective electrode consists of at least Al.

The translucent conductive substrates used in the present examples are manufactured as follows:

The glass substrate is a clear soda lime glass made by AGC with a thickness of 1.60 mm. The scattering layer is deposited on the glass support as follow: the glass frit material was mixed so that the glass composition may become, in mol % based on oxides, 22.7 mol % of $P_2O_5$, 14.9 mol % of $Bi_2O_3$, 15.7 mol % of $Nb_2O_5$, 20.6 mol % of ZnO, 11.8 mol % of $B_2O_3$, 5.0 mol % of $Li_2O$ and 9.3 mol % of $WO_3$. After that, the prepared frit material was dissolved spending 90 minutes at 1050° C. in electric furnace, and after holding for 60 minutes at 950° C., the glass flakes was obtained by a roll cast. The glass transition temperature of this glass is 475° C., its deformation point is 525° C., the thermal expansion coefficient is $72 \times 10-7(1/° C.)$ (average value of from 50 to 300° C.). The measurement was done at 5° C./min by the thermal expansion method by using the thermal analysis equipment (Made by the Bruker company, the brand name: TD5000SA). Moreover, the refractive index nF at F-line (486.13 nm) is 2.00, the refractive index nd at d-line (587.56 nm) is 1.98, the refractive index nC at C-line (656.27 nm) is 1.97. The refractive index meter (Made by Shimadzu Device corporation, the brand name: KPR-2000) is used.

After crushing the manufactured glass flakes for two hours in the planetary mill made of zirconia, the crushed glass flakes were put through a sieve to obtain the glass frits. At this time, the particle size distribution of the glass flakes is that $D_{50}$ was 2.15 μm, $D_{10}$ was 0.50 μm, and $D_{90}$ was 9.72 μm. $D_{50}$=2.15 um means that 50% of the particles have a particle size lower than or equal to 2.15 μm, $D_{10}$=0.50 μm means that 10% of the particles have a particle size lower than or equal to 0.5 μm and $D_{90}$=9.72 μm means that 90% of the particles have a particles size lower than or equal to 9.72 μm. The particles size is determined by TEM (Transmission Electron Microscope) pictures. Next, the obtained glass frits 35 g were mixed with the organic vehicle which was dissolved by ··-terpineol and ethyl cellulose to obtain glass paste. The glass paste was uniformly printed on the glass support in the circle where the diameter was 10 mm, causing an after-firing thickness to be 14 μm. After drying this substrate for 30 minutes at 150° C., the substrate was returned to room temperature once. The temperature rose up to 450° C. by taking 45 minutes. Then, the substrate was held for 30 minutes at 450° C. to be fired. Afterwards, the temperature rose up to 580° C. by taking 13 minutes, held for 30 minutes at 580° C. and was done up to the room temperature by taking three hours. Therefore, the scattering layer was formed on the glass support.

The layers forming the electrode (12) of the examples of translucent conductive substrate (1) according to the invention have been deposited by magnetron sputtering onto a clear glass support (10) with a thickness of 1.60 mm.

The deposition conditions for each of the layers are as follows:
- the $TiO_2$-based layers are deposited using a titanium target at a pressure of 0.5 Pa in an $Ar/O_2$ atmosphere,
- the $Zn_xSn_yO_z$-based layers are deposited using a target of ZnSn alloy at a pressure of 0.5 Pa in an $Ar/O_2$ atmosphere,
- the Ag-based layers are deposited using an Ag target at a pressure of 0.5 Pa in an Ar atmosphere,
- the Ti-based layers are deposited using a Ti target at a pressure of 0.5 Pa in an Ar atmosphere and can be partially oxidised by the subsequent $Ar/O_2$ plasma,
- the layers for homogenizing surface electrical properties based on Ti nitride are deposited using a Ti target at a pressure of 0.5 Pa in an 80/20 $Ar/N_2$ atmosphere.

Compare to an ITO electrode, the deposition conditions require a lower temperature which reduces the risk of an alkaline migration from the support of the scattering layer.

EXAMPLES

Table I shows four columns with examples of translucent conductive substrates (1) not in conformity with the invention as well as the results of measurements of electrical and optical performance obtained by means of the organic light-emitting device in which these substrates are incorporated. The general structure of the organic light-emitting device has been described above. Example I.1R is an ITO electrode. Example I.2R is an ITO with a scattering layer. Example I.3R is a translucent conductive substrate without scattering layer and having an electrode that is not optimised, since the thickness of the improvement coating (120) has not been optimised and therefore lies outside the optical thickness range complying with equation: $T_{ME}=T_{ME\_0}+[B*\sin(\pi*T_{D1}/T_{D1\_0})]/(n_{support})^3$. Example I.4R is a translucent conductive substrate without scattering layer and comprising an electrode wherein the thickness of the improvement coating (120) has been optimised and therefore lies inside the optical thickness range complying with equation: $T_{ME}=T_{ME\_0}+[B*\sin(\pi*T_{D1}/T_{D1\_0})]/(n_{support})^3$. In examples I.3R and I.4R, the improvement coating (120) has a barrier layer (1200), which is merged with a layer for improving light transmission (1201) and this layer is covered by a crystallisation layer (1202). Moreover, the crystallisation (1202) and insertion (123) layers are of the same nature. These layers are made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer based on an architectural low-emission stacking structure having a conduction layer of Ag (122).

TABLE I

| Examples | I.1 R | I.2R | I.3R | I.4R |
| --- | --- | --- | --- | --- |
| Scattering layer (nm) (11) | — | 50 | — | — |
| Electrode (12) Coating | | Nature/Thickness (nm) | | |
| Layers Improvement (120) | | | | |
| Barrier (1200) | ITO/ 90.0 | ITO/ 90.0 | $TiO_2$/20.0 | $TiO_2$/65.0 |
| Improvement (1201) | | | | |
| Crystallisation (1202) | | | $Zn_xSn_yO_z$/5.0 | $Zn_xSn_yO_z$/5.0 |
| Conduction layer (112) | | | Ag/12.5 | Ag/12.5 |
| Sacrificial layer (111b) | | | Ti/2.5 | Ti/2.5 |
| Insertion layer (113) | | | $Zn_xSn_yO_z$/7.0 | $Zn_xSn_yO_z$/7.0 |
| Homogenisation layer (114) | | | Ti nitride/1.5 | Ti nitride/1.5 |
| Resistance (Ω/□) | 35.00 | 35.00 | 4.00 | 3.78 |
| OCE | 1.0 | 1.5 | 1.0 | 1.2 |
| Δx (with scattering layer) | — | 0.00140 | — | — |

TABLE I-continued

| Examples | I.1 R | I.2R | I.3R | I.4R |
|---|---|---|---|---|
| Δx (without scattering layer) | 0.01310 | — | 0.20000 | 0.17000 |
| Δy (with scattering layer) | — | 0.00245 | — | — |
| Δy (without scattering layer) | 0.02250 | — | 0.20000 | 0.16000 |

The support (10) is a clear glass with a geometric thickness equal to 1.60 mm.

Table II shows two columns with examples of translucent conductive substrates (1) according to the invention and having different types of electrodes as well as the electrical and optical performance of the organic light-emitting device in which these are incorporated. Example 11.5 is a translucent conductive substrate with a scattering layer and comprising an electrode that is not optimized, since the thickness of the improvement coating (120) lies outside the optical thickness range complying with equation: $T_{ME}=T_{ME\_0}+[B^*\sin(\pi^*T_{D1}/T_{D1\_0})]/(n_{support})_3$. Example II.6 is a translucent conductive substrate with a scattering layer and having an electrode that is optimized for an OLED, since the thickness of the improvement coating (120) lies inside the optical thickness range complying with equation: $T_{ME}=T_{ME\_0}+[B^*\sin(\pi^*T_{D1}/T_{D1\_0})]/(n_{support})^3$. In the examples II.5 and II.6, the improvement coating (120) has a barrier layer (1200) which is covered by a crystallisation layer (1202). Moreover, the crystallisation (1202) and insertion (123) layers are of the same nature. These layers are made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer.

TABLE II

| Examples | | II.5 | II.6 |
|---|---|---|---|
| Scattering layer (μm) (11) | | 50 | 50 |
| Electrode (12) | | Nature/Thickness(nm) | |
| Coating | Layers | | |
| Improvement (120) | Barrier (1200) | $TiO_2$/20.0 | $TiO_2$/60.0 |
| | Improvement (1201) | | |
| | Crystallisation (1202) | $Zn_xSn_yO_z$/5.0 | $Zn_xSn_yO_z$/10.0 |
| Conduction layer (122) | | Ag/12.5 | Ag/12.5 |
| Sacrificial layer (121b) | | Ti/2.5 | Ti/2.0 |
| Insertion layer (123) | | $Zn_xSn_yO_z$/7.0 | $Zn_xSn_yO_z$/7.0 |
| Homogenisation layer (124) | | Ti nitride/1.5 | Ti nitride/1.5 |
| Δx (with scattering layer) | | 0.02100 | 0.02400 |
| Δy (with scattering layer) | | 0.03300 | 0.01400 |
| OCE | | 1.1 | 1.9 |

The support (10) is a clear glass with a geometric thickness equal to 1.60 mm.

The comparison of examples II.5 and II.6 with the comparative examples I.1R, I.2R, I.3R and I.4R clearly shows the advantages provided by the translucent conductive substrate according to the invention in terms of optical performance.

The out-coupling coefficient efficiency (OCE) is the factor that defines the amount of light that can be extracted compared to that of a reference. OCE is calculated in regards to the reference represented in example I.1R. The OCE values are determined as follows:

The luminance of each OLED incorporating the substrate of the example I.1R, I.2R, I.3R, I.4R, II.5 and II.6 were measured at an angle θ=0°. The voltage applied on each sample is the once required to obtain a current intensity of 6 mA.

The OCE were obtained by dividing the luminance values obtained by the value of the luminance measured for example I.1R.

The optical measurement were performed thanks to a multi-channel spectroscope (trade name: C10027) manufactured by Hamamatsu Photonics K.K. For the definition of the angle, the angle between a normal line direction of the element and a direction extending from the element to the spectroscope was defined as the measurement angle θ (FIG. 21).

Surprisingly, the inventors found that small variation in the structure of the multilayered translucent conductive substrate have a significant influence on the OCE. This effect on the OCE is found despite the fact that the refractive index of the first layer of the multilayer electrode is comparable to that of the scattering layer. The comparison of example I.3R and II.5 but also of examples I.4R and II.6 shows the effect of the scattering layer on the OCE. In the case of an electrode stacking structure such as describes in examples I.3R and II.5, the incorporation of the scattering layer leads to an increase of 10% of the OCE. In the case of an electrode stacking structure such as describe in example I.4R and II.6, the incorporation of the scattering layer leads to an increase of the OCE of 58%.

The inventors have surprisingly found as shows by the comparison of example I.3R and II.6 that an increase of around 90% of the OCE is obtained when a translucent conductive substrate according to the invention is used. In addition, the comparison of the OCE obtained shows a synergetic effect of the scattering layer and the optimized electrode on the OCE. If the effect would be simply cumulative an increase of 30% of the OCE would be obtained: 10% thanks to the scattering layer used and 20% thanks to the optimized electrode. Furthermore, the comparison of the OCE clearly shows that the amount of light emitted by the example 11.6 is 90% higher than the amount of light emitted by the example I.1R which represents a conventional substrate for OLED (ITO electrode on glass)

Finally, the comparison of the values Δx(with scattering layer), Δx(without scattering layer), Δy(with scattering layer), Δy(without scattering layer) shows the positive effect of the scattering layer on the angular dependency. x and y representing the chromaticity coordinates in the CIE (x,y) chromaticity diagram. The terms "with scattering layer" and "without scattering layer" are respectively linked to a translucent conductive substrate with and without scattering layer.

Where:

$$\Delta x(\text{withoutscatteringlayer})=x_{max}^{0°-70°}-x_{min}^{0°-70°}$$

$x_{max}^{0°-70°}$ represents the highest x value measured between 0° and 70°; $x_{min}^{0°-70°}$ represents the lowest x value measured between 0° and 70°

$$\Delta x(\text{withscatteringlayer})=x_{max}^{0°-70°}-x_{min}^{0°-70°}$$

$x_{max}^{0°-70°}$ represents the highest x value measured between 0° and 70°; $x_{min}^{0°-70°}$ represents the lowest x value measured between 0° and 70°

$$\Delta y(\text{withoutscatteringlayer})=y_{max}^{0°-70°}-y_{min}^{0°-70°}$$

$y_{max}^{0°-70°}$ represents the highest y value measured between 0° and 70°; $y_{min}^{0°-70°}$ represents the lowest y value measured between 0° and 70°

$$\Delta y(\text{withscatteringlayer})=y_{max}^{0°-70°}-y_{min}^{0°-70°}$$

$y_{max}^{0°-70°}$ represents the highest y value measured between 0° and 70°; $y_{min}^{0°-70°}$ represents the lowest y value measured between 0° and 70°

The optical measurement were performed thanks to a multichannel spectroscope (trade name: C10027) manufactured by Hamamatsu Photonics K.K. For the definition of the angle, the angle between a normal line direction of the element and a direction extending from the element to the spectroscope was defined as the measurement angle θ (FIG. 21). The measurement was made while rotating the OLED to the spectroscope, thereby measuring the angular dependency of light emitting colour The value x and y are measured as follows:

The luminance of each OLED incorporating the substrate of the example I.1R, I.2R, I.3R, I.4R, II.5 and II.6 were measured at different angles from θ=0° to 70°. The voltage applied on each sample is the one required to obtain a current intensity of 6 mA.

Finally, from an electrical point of view, the resistance value (around 4Ω/□) obtained for a translucent conductive substrate according to the invention are lower than the resistance value obtained with a classical ITO substrate (around 35Ω/□)

Table III shows three columns with examples of translucent conductive substrates according to the invention comprising a scattering layer and having different types of electrodes (numbers of layers, chemical nature and thickness of layers) and the measurement results of resistance expressed in Ω/□. The general structure of the organic light-emitting device has been described above. Example III.1 is a translucent conductive substrate having an electrode comprising a conduction layer of Ag (122), a layer for homogenizing surface electrical properties (124), an improvement coating wherein the thickness of the improvement coating (120) has not been optimised, since the thickness of the improvement coating (120) lies outside the optical thickness range complying with equation: $T_{ME}=T_{ME\_0}+[B*\sin(\pi*T_{D1}/T_{D1\_0})]/(n_{support})^3$. In this example, the improvement coating (120) comprises a barrier layer (1200), which is merged with an improvement layer (1201) and this layer is covered by a crystallisation layer (1202). Moreover, the crystallisation (1202) and insertion (123) layers are of the same nature. These layers are made of $Zn_xSn_yO_z$ (where x+y≥3 and z≤6), the $Zn_xSn_yO_z$ comprising at most 95% by weight of zinc, the percentage by weight of zinc being expressed in relation to the total weight of the metals present in the layer. Examples III.2 and III.3 illustrate translucent conductive substrates in conformity with the invention. In these examples, the improvement coating (120) has an optical thickness complying with equation $T_{ME}=T_{ME\_0}+[B*\sin(\pi*T_{D1}/T_{D1\_0})]/(n_{support})^3$ and having a barrier layer (1200), which is merged with an improvement layer (1201) and this layer is covered by a crystallisation layer (1102). Moreover, the crystallisation (1202) and insertion (124) layers are of the same nature. These layers are made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer. Example III.3 illustrates a translucent conductive substrate in accordance with the invention having an electrode that is optimised with respect to the geometric thickness of the crystallisation layer (1102).

TABLE III

| Examples | III.1 | III.2 | III.3 |
| --- | --- | --- | --- |
| Scattering layer (μm) (11) Coating | 50 | 50 | 50 |
| Layers | Nature/thickness (nm) | Nature/thickness (nm) | Nature/thickness (nm) |
| Improvement (120) | $TiO_2$/20.0 | $TiO_2$/65.0 | $TiO_2$/60.0 |
| Barrier (1200) Improvement (1201) | | | |
| Crystallisation (1202) | $Zn_xSn_yO_z$/5.0 | $Zn_xSn_yO_z$/5.0 | $Zn_xSn_yO_z$/10.0 |
| Conduction layer (122) | Ag/12.5 | Ag/12.5 | Ag/12.5 |
| Sacrificial layer (121b) | Ti/2.5 | Ti/2.5 | Ti/2.5 |
| Insertion layer (123) | $Zn_xSn_yO_z$/7.0 | $Zn_xSn_yO_z$/7.0 | $Zn_xSn_yO_z$/7.0 |
| Homogenisation layer (124) | Ti nitride/1.5 | Ti nitride/1.5 | Ti nitride/1.5 |
| Resistance (Ω/□) | 3.78 | 4.09 | 3.91 |

The support (10) is a clear glass with a geometric thickness equal to 1.60 mm.

As described above, the translucent conductive substrate according to the invention has an electrode that has at least one additional insertion layer (123). The function of this insertion layer (123) is to form part of an optical cavity that enables the metal conduction layer to become transparent. In fact, it is known to a person skilled in the art optimising low-emission multilayer coatings, for example, that the use of an insertion layer with a geometric thickness of at least 15.0 nm is necessary to make the conduction layer transparent. On the other hand, no conductivity condition is imposed to obtain optical transparency values compatible with architectural applications. The layers developed for architectural application cannot be used directly for optoelectronic applications, since they generally contain dielectric compounds and/or poorly conductive compounds.

The inventors have surprisingly determined that the geometric thickness of the insertion layer ($E_{in}$) (123) is such that, firstly, its ohmic thickness is at most equal to $10^{12}$ ohm, preferably at most equal to $10^4$ ohm, wherein the ohmic thickness is equal to the relation between the resistivity of the material forming the insertion layer (·), on the one hand, and the geometric thickness of this same layer (l), on the other; and secondly, the geometric thickness of the insertion layer (123) is linked to the geometric thickness of the first organic layer of the organic light-emitting device ($E_{org}$), the term "first organic layer" denoting all the organic layers disposed between the insertion layer (123) and the organic light-emitting layer. The inventors have thus surprisingly found, as indicated in FIG. 20, that two areas characterized by the luminance maxima were observed:

the first area corresponding to the equation: $E_{org}=A-E_{in}$, where A is a constant having a value in the range of 5.0 to 75.0 nm, preferably from 20.0 to 60.0 nm, more preferred from 30.0 to 45.0 nm.

the second area corresponding to the equation: $E_{org}=C-E_{in}$, where C is a constant having a value in the range of 150.0 to 250.0 nm, preferably from 160.0 to 225.0 nm, more preferred from 75.0 to 205.0 nm.

The inventors have thus found that the equations $E_{org}=A-E_{in}$ or $E_{org}=C-E_{in}$ allow the geometric thickness of the first organic layer of the organic light-emitting device to be used to optimize the optical parameters (geometric thickness and refractive index) of the insertion layer and therefore to optimize the amount of light transmitted while retaining a thickness of the insertion layer that is compatible with the electrical properties that enable high ignition voltages, i.e. respectively for a first and a second luminance maximum, to be avoided.

Moreover, the use of a dielectric, i.e. poorly conductive, layer for contact between the conduction layer and the organic portion of the organic light-emitting device runs counter to the customarily accepted knowledge of a skilled person who has to manufacture organic light-emitting devices. The inventors have surprisingly found that the use of a dielectric, i.e. poorly conductive, material does not have to be excluded for the formation of the insertion layer (123). However, a conductive material is preferred. In fact, if the insertion layer has too high an ohmic thickness, the voltages of use increase considerably, as shown in Table IV.

Table IV shows two columns with examples of translucent conductive substrates according to the invention and having different types of electrodes (numbers of layers, chemical nature and thickness of layers) as well as the results of measurements of electrical performance obtained by means of the organic light-emitting device in which these substrates are incorporated. The general structure of the organic light-emitting device has been described above. Example IV.1 is a translucent conductive substrate comprising an electrode based on a structure having a conduction layer of Ag (122), the electrode is not optimised. The electrode of the example IV.1 has a homogenisation layer (124) and a coating for improving light transmission (120), of which the optical thickness has not been optimised and therefore lies outside the thickness range complying with equation $T_{ME}=T_{ME\_0}+[B*\sin(\pi*T_{D1}/T_{D1\_0})]/(n_{support})^3$. In example IV.1 the improvement coating (120) comprises a barrier layer (1200), which is merged with an improvement layer (1201) and this layer is covered by a crystallisation layer (1202). Moreover, the crystallisation (1202) and insertion (123) layers are of the same nature. These layers are made of $Zn_xSn_yO_z$ (where x+y≥3 and z≤6), the $Zn_xSn_yO_z$ comprising at most 95% by weight of zinc, the percentage by weight of zinc being expressed in relation to the total weight of the metals present in the layer. Moreover, example IV.1 also shows an insertion layer (123) with a geometric thickness that has not been optimised. Example IV.2 illustrates an optimised electrode, the improvement coating (120) has an optical thickness complying with equation $T_{ME}=T_{ME\_0}+[B*\sin(\pi*T_{D1}/T_{D1\_0})]/(n_{support})^3$, the improvement coating has a barrier layer (1200), which is merged with an improvement layer (1201) and this layer is covered by a crystallisation layer (1202). Moreover, the crystallisation (1202) and insertion (124) layers are of the same nature. These layers are made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer. It is evident that the electrical properties of example IV.2 are appreciably higher than those shown in example IV.1.

TABLE IV

| Examples | | IV.1 | IV.2 |
|---|---|---|---|
| Scattering layer (11) | | 50 μm | 50 μm |
| Coating | Layers | Nature/thickness (nm) | Nature/thickness (nm) |
| Improvement (120) | Barrier (1200) | TiO$_2$/20.0 | TiO$_2$/65.0 |
| | Improvement (1201) | | |
| | Crystallisation (1202) | Zn$_x$Sn$_y$O$_z$/5.0 | Zn$_x$Sn$_y$O$_z$/5.0 |
| Conduction layer (122) | | Ag/12.5 | Ag/12.5 |
| Sacrificial layer (121b) | | Ti/2.5 | Ti/2.5 |
| Insertion layer (123) | | Zn$_x$Sn$_y$O$_z$/14.0 | Zn$_x$Sn$_y$O$_z$/7.0 |
| Homogenisation layer (124) | | — | Ti nitride/1.5 |
| Electrical performance V at 10 mA/cm$^2$ | | 4.45 5.60 | 2.70 3.55 |
| V at 100 mA/cm$^2$ | | | |

The support (10) is a clear glass with a geometric thickness equal to 1.60 mm.

Finally, Table V shows that with a constant geometric thickness of the insertion layer, it is possible to reduce the voltages of use, decreasing the resistivity of this layer. In fact, Table V shows three columns with examples of translucent conductive substrates, which are in accordance with the invention but differ from one another with respect to the nature of the chemical compound forming the insertion layer, as well as the results of measurements of electrical and optical performance obtained by means of the organic light-emitting device in which these electrodes are incorporated. The general structure of the organic light-emitting device has been described above. Example V.1 illustrates a translucent conductive substrate according to the invention that has an electrode with an insertion layer comprising a conductive layer made of zinc oxide doped with aluminium (resistivity of ZnO:Al: $10^{-4}$ Ω*cm). Example V.2 illustrates a translucent conductive substrate according to the invention that has an electrode with an insertion layer comprising a poorly conductive layer made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer (resistivity of $Zn_xSn_yO_z$: $10^{-2}$ Ω*cm). Example V.3 illustrates a translucent conductive substrate according to the invention that has an electrode with an insertion layer comprising a dielectric layer of titanium dioxide (resistivity of TiO$_2$: 70 10$^4$ Ω*cm).

It is evident that to reach a current level of 100 mA, the voltage to be applied is lower in the case of a conductive insertion layer with a layer made from a conductive material than in the case of a layer made from a dielectric material.

TABLE V

| Examples | V.1 | V.2 | V.3 |
|---|---|---|---|
| Scattering layer (11) | 50 μm | 50 μm | 50 μm |
| Coating | | | |
| Layers | Nature/thickness (nm) | Nature/thickness (nm) | Nature/thickness (nm) |
| Improvement (120) | | | |
| Barrier (1200) | TiO$_2$/65.0 | TiO$_2$/65.0 | TiO$_2$/65.0 |
| Improvement (1201) | | | |
| Crystallisation (1202) | Zn$_x$Sn$_y$O$_z$/5.0 | Zn$_x$Sn$_y$O$_z$/5.0 | Zn$_x$Sn$_y$O$_z$/5.0 |
| Conduction layer (122) | Ag/12.5 | Ag/12.5 | Ag/12.5 |
| Sacrificial layer (121b) | Ti/2.5 | Ti/2.5 | Ti/2.5 |
| Insertion layer (123) | ZnO:Al/7.0 | Zn$_x$Sn$_y$O$_z$/7.0 | TiO$_2$/7.0 |
| Homogenisation layer (124) | Ti nitride/1.5 | Ti nitride/1.5 | Ti nitride/1.5 |
| Electrical performance V at 100 mA/cm$^2$ | 2.98 | 3.55 | 3.98 |

The support (10) is a clear glass with a geometric thickness equal to 1.60 mm.

Table VI shows organic light-emitting devices that emit a quasi-white light. The general structure of the organic light-emitting device that emit a quasi-white light whose performances are shown in Table VI have the following structure, starting with the translucent conductive substrate:

- a layer of N,N,N',N''-tetrakis(4-methoxyphenyl)-benzidine (abbreviated to MeO-TPD) doped with 4 mole % of NPD-2
- a layer of N,N'-di(naphthalen-1-yl)-N—N-diphenyl-benzidine (abbreviated to NPB),
- a stacking structure of emission layers formed from 4,4', 4''-tris(N-carbazolyl)-triphenylamine (abbreviated to TCTA) and from 2,2',2"(1,3,5-benzenetriyl)tris(1-phenyl-1H-benzidimazole) (abbreviated to TBPi) partially doped with iridium-bis-(4,6-difluorophenyl-pyridinato-N,C2)-picolinate (abbreviated to FirPic), tris[2-(2-pyridinyl)phenyl-C,N]iridium (abbreviated to Ir(ppy)3) and iridium (III)bis(2-methyldibenzo[f,h]quinoxaline)(acetylacetonate) (abbreviated to Ir5MDQ)2 (acac), a layer of 2,2',2"(1,3,5-benzenetriyl)tris-(1-phenyl-1H-benzimidazole) (abbreviated to TBPi), a layer of 4,7-diphenyl-1,10-phenanthroline doped with Cs, an upper reflective electrode composed of at least one metal. According to a preferred embodiment, the metal of the upper reflective electrode consists of at least Ag. According to an alternative embodiment, the metal of the upper reflective electrode consists of at least Al.

The acronyms used to denote the compounds used are well known to the person skilled in the art. The structure of the organic layers used is described in page 237 in section "Methods Summary" of the article by Reineke et Coll. in Nature, 2009, vol. 459, pp. 234 to 238.

The scattering layer (11) and the electrode (12) of the examples of translucent conductive substrate (1) according to the invention have been deposited following the conditions describe here above. Example VI.1 is a translucent conductive comprising an electrode based on a stacking structure having a conduction layer of Ag. Example VI.1 is a translucent conductive substrate according to the invention that comprises an electrode that is not optimised for an OLED having a homogenisation layer (124) and wherein the thickness of the improvement coating (120) lies outside the thickness range complying with equation:

$$T_{ME} = T_{ME\_0} + [B^* \sin(\pi^* T_{D1}/T_{D1\_0})]/(n_{support})^3$$

In example VI.1 the improvement coating (120) comprises a barrier layer (1200), which is merged with an improvement layer (1201) and this layer is covered by a crystallisation layer (1202). Moreover, the crystallisation (1202) and insertion (123) layers are of the same nature. These layers are made of $Zn_xSn_yO_z$ (where $x+y \geq 3$ and $z \leq 6$), the $Zn_xSn_yO_z$ comprising at most 95% by weight of zinc, the percentage by weight of zinc being expressed in relation to the total weight of the metals present in the layer. Examples VI.2 and VI.3 show examples wherein the improvement coating (2) has an optical thickness complying with equation $T_{ME} = T_{ME\_0} + [B^* \sin(\pi^* T_{D1}/T_{D1\_0})]/(n_{support})^3$ and this has a barrier layer (1200), which is merged with an improvement layer (1201) and this layer is covered by a crystallisation layer (1202). Moreover, the crystallisation (1202) and insertion (124) layers are of the same nature. These layers are made of $Zn_xSn_yO_z$ (where $x+y \geq 3$ and $z \leq 6$), the $Zn_xSn_yO_z$ preferably comprising at most 95% by weight of zinc, the percentage by weight of zinc being expressed in relation to the total weight of the metals present in the layer. Moreover, example VI.2 more particularly illustrates a translucent conductive substrate having a fine metal layer and having a more significant thickness of coating for improving light transmission properties. The advantage of such thickness of the improvement coating is that:

it allows, on the one hand, better protection of the metal conduction layer against any contamination of said layer by migration of pollutants (e.g.: alkaline substances) coming from the support or the scattering layer, on the other hand, it allows less precious metal to be used for the formation of the metal conduction layer.

Example VI.3 illustrates a translucent conductive substrate having a thick silver layer that allows a conduction layer with a low resistance to be obtained. The comparison of the properties obtained for devices emitting quasi-white light incorporating a translucent conductive substrate according to examples VI.1, VI.2 and VI.3 demonstrates that:

the service lives of the devices comprising a substrate according to the invention are longer compared to example VI.1, but also compared to a translucent conductive substrate consisting of an identical support (10) and with an electrode of ITO disposed on top of it that has a geometric thickness equal to 90 nm, the service life of which amounts to 162 hours (result not established in Table VI);

the surface resistance ($\Omega/\square$) of example VI.3 having a thick conduction layer is at least half as low as the surface resistance ($\Omega/\square$) of examples VI.2 and VI.1, and this property provides the possibility of forming devices of larger dimensions without using any conduction reinforcement such as a metal grid, for example.

TABLE VI

| Examples | VI.1 | VI.2 | VI.3 |
|---|---|---|---|
| Scattering layer (11) Coating | 50 μm | 50 μm | 50 μm |
| Layers | Nature/thickness (nm) | Nature/thickness (nm) | Nature/thickness (nm) |
| Improvement (120) | | | |
| Barrier (1200) Improvement (1201) | TiO$_2$/20.0 | TiO$_2$/65.0 | TiO$_2$/20.0 |
| Crystallisation (1202) | Zn$_x$Sn$_y$O$_z$/5.0 | Zn$_x$Sn$_y$O$_z$/5.0 | Zn$_x$Sn$_y$O$_z$/5.0 |
| Conduction layer (122) | Ag/12.5 | Ag/12.5 | Ag/23.0 |
| Sacrificial layer (121b) | Ti/2.5 | Ti/2.5 | Ti/2.5 |
| Insertion layer (123) | Zn$_x$Sn$_y$O$_z$/7.0 | Zn$_x$Sn$_y$O$_z$/7.0 | Zn$_x$Sn$_y$O$_z$/7.0 |
| Homogenisation layer (124) | Ti nitride/1.5 | Ti nitride/1.5 | Ti nitride/1.5 |
| Resistance ($\Omega/\square$) | 3.78 | 4.09 | 1.80 |
| Electrical performance V at 2 mA/cm$^2$ | 9.7-10.4 | 9.2-9.4 | 10.1-10.5 |
| Service life (in hours) measured at 30 mA/cm$^2$ | 166 | 625 | 739 |

The support (10) is a clear glass with a geometric thickness equal to 1.60 mm.

The electrical performance levels are measured by applied voltages (V) to obtain a current of 2 mA/cm$^2$.

Table VII shows organic light-emitting devices that emit a quasi-white light. The general structure of the organic light-emitting device that emit a quasi-white light whose performances are shown in Table VII have the following organic structure, starting from the translucent conductive substrate:

a layer of N,N'-bis(1-naphthyl)-N,N'-diphenyl-1,1'-biphenyl-4,4'-diamine, abbreviated to alpha-NPD, a layer of NPD+5,6,11,12-tetraphenylnaphthacene abbreviated rubrene, a layer of 2-methyl-9,10-di(2-naphthyl) anthracene, abbreviated to MADN+p-bis_p-N,N-di-phenyl-aminostyryl benzene, abbreviated to DSA, a layer of tris(8-hydroxyquinoline) aluminium, abbreviated to AlQ3, a layer of LiF, the upper reflective electrode is also composed of at least one metal. According to a preferred embodiment, the metal of the upper reflective electrode consists of at least Ag. According to an alternative embodiment, the metal of the upper reflective electrode consists of at least Al.

The scattering layer (11) and the electrode (12) of the examples of translucent conductive substrate (1) according to the invention have been deposited following the conditions describe here above, said scattering layer having, in example VII.2, the same composition as the composition used in the previous examples but comprising an additional amount of 15 vol. % of alumina particles having 3 μm in diameter in examples VII.1 and VII.3. Moreover, the layers based on TiOx and ZnO:Al are respectively deposited using a TiOx ceramic target at a pressure of 0.5 Pa in an Ar/O2 atmosphere and using a ZnO:Al ceramic target in an Ar/O2 atmosphere, a weak percentage O2 being introduced (0-0.7%), at a pressure of 0.5 Pa. Examples VII.1 and VII.2 are translucent conductive substrates comprising an electrode based on a stacking structure having a conduction layer of Ag. Examples VII.1 and VII.2 are translucent conductive substrates according to the invention that comprise an electrode that is not optimised for an OLED having a homogenisation layer (124) and wherein the thickness of the improvement coating (120) lies outside the thickness range complying with equation:

$$T_{ME}=T_{ME\_0}+[B*\sin(\pi*T_{D1}/T_{D1\_0})]/(n_{support})^3$$

In example VII.1, the improvement coating (120) comprises a barrier layer (1200), which is merged with an improvement layer (1201) and this layer is covered by a crystallisation layer (1202). Moreover, the crystallisation (1202) and insertion (123) layers are conductive layers of the same nature. These layers are made of zinc oxide doped with aluminium (resistivity of ZnO:Al:$10^{-4}$ Ω*cm). In example VII. 2, the improvement coating (120) comprises a barrier layer (1200), an improvement layer (1201) and a crystallization layer (1202) which are merged and made of $Zn_xSn_yO_z$ (where x+y≥3 and z≤6), the $Zn_xSn_yO_z$ preferably comprising at most 95% by weight of zinc, the percentage by weight of zinc being expressed in relation to the total weight of the metals present in the layer. Example VI.3 shows an example wherein the improvement coating (120) has an optical thickness complying with equation $T_{ME}=T_{ME\_0}+[B*\sin(\pi*T_{D1}/T_{D1\_0})]/(n_{support})^3$ and this improvement coating (120) has a barrier layer (1200), which is merged with an improvement layer (1201) and said improvement layer (1201) is covered by a crystallisation layer (1202). Moreover, the crystallisation (1202) and insertion (124) layers are of the same nature. These layers are made of zinc oxide doped with aluminium (resistivity of ZnO:Al:$10^{-4}$ Ω*cm). The sacrificial layer (121b) is made of $TiO_x$, said $TiO_x$ being a titanium oxide fully or partially oxidized.

TABLE VII

| Examples | VII.1 | VII.2 | VII.3 |
|---|---|---|---|
| Scattering layer (11) Coating | 25 μm[1] | 25 μm | 25 μm[1] |
| Layers | Nature/thickness (nm) | Nature/thickness (nm) | Nature/thickness (nm) |
| Improvement (120) | | | |
| Barrier (1200) | $TiO_2$/19.0 | $Zn_xSn_yO_z$/25.0 | $TiO_2$/60.0 |
| Improvement (1201) | | | |
| Crystallisation (1202) | ZnO:Al/4.0 | ZnO:Al/4,0 | ZnO:Al/10.0 |
| Conduction layer (122) | Ag/9.45 | Ag/9,0 | Ag/14.35 |
| Sacrificial layer (121b) | $Ti_xO$/3.0 | $Ti_xO$/3.0 | $Ti_xO$/3.0 |
| Insertion layer (123) | ZnO:Al/7.0 | ZnO:Al/7.0 | ZnO:Al/7.0 |
| Homogenisation layer (124) | Ti nitride/1.5 | Ti nitride/1.5 | Ti nitride/1.5 |
| OCE | 1.3 | 1.2 | 1.9 |

[1]the scattering layer comprises an additional amount of 15 vol. % of alumina particles having 3 μm in diameter.

The out-coupling coefficient efficiency (OCE) is the factor that defines the amount of light that can be extracted compared to that of a reference. OCE is calculated in regards to the reference represented in example I.1R. The OCE values are determined as follows:

The luminance of each OLED incorporating the substrate of the example I.1R, VII.1, VII. 2 and VII.3 were measured at an angle θ=0°. The voltage applied on each sample is the once required to obtain a current intensity of 6 mA.

The OCE were obtained by dividing the luminance values obtained by the value of the luminance measured for example I.1R.

The optical measurement were performed thanks to a multi-channel spectroscope (trade name: C10027) manufactured by Hamamatsu Photonics K.K. For the definition of the angle, the angle between a normal line direction of the element and a direction extending from the element to the spectroscope was defined as the measurement angle θ (FIG. 21).

The invention claimed is:

1. A translucent conductive substrate, comprising:
   a transparent support;
   a scattering layer formed over the transparent support and comprising a glass comprising a base material having a first refractive index for at least one wavelength of light to be transmitted and a plurality of scattering materials dispersed in the base material and having a second refractive index different from the first refractive index; and
   a transparent electrode formed over the scattering layer, said electrode comprising at least one metal conduction layer and at least one coating having properties for improving light transmission through said electrode, such that said coating comprises at least one layer for improving light transmission and is located between the metal conduction layer and the scattering layer,
   wherein the at least one coating having properties for improving the light transmission through said electrode has a geometric thickness at least more than 3.0 nm and at most less than or equal to 200 nm, and
   wherein a geometric thickness of the coating having properties for improving the light transmission, $T_{D1}$, and a geometric thickness of the metal conduction layer, $T_{ME}$, are linked by the equation:

$$T_{ME}=T_{ME\_0}+[B*\sin(\pi*T_{D1}/T_{D1\_0})]/(n_{support})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9*n_{D1}$ to $28.3*n_{D1}$ nm, with $n_{D1}$ representing the refractive index of the coating for improving the light transmission at a wavelength of 550 nm and $n_{support}$ represents the refractive index of the transparent support at a wavelength of 550 nm.

2. The conductive substrate according to claim 1, wherein the plurality of scattering materials are selected from the group consisting of pores, precipitated crystals, material particles having a different chemical composition than the base material, a phase-separated glass, and mixtures thereof.

3. The conductive substrate according to claim 2, wherein the plurality of scattering materials are material particles selected from the group consisting of crystalline particles, amorphous particles, and mixtures thereof.

4. The conductive substrate according to claim 1, wherein a distribution of the scattering materials in the scattering layer decreases from the inside of the scattering layer towards a face of the scattering layer opposite to the transparent support on which said scattering layer is deposited.

5. The conductive substrate according to claim 1, wherein the scattering layer comprises a first layer part and a second layer part formed on the first layer part, said second layer part being thinner than the first layer part and the first layer part comprising more of the scattering materials than the second layer part.

6. The conductive substrate according to claim 1, wherein the coating for improving light transmission of the electrode further comprises at least one additional crystallisation layer, wherein, in relation to the scattering layer, said crystallisation layer is a layer within said coating furthest removed from a stacking structure comprising said scattering layer.

7. The conductive substrate according to claim 6, wherein a geometric thickness of the crystallisation layer is at least equal to 7% of the total geometric thickness of the coating for improving light transmission.

8. The conductive substrate according to claim 1, wherein the coating for improving light transmission further comprises at least one additional barrier layer, wherein, in relation to the scattering layer, said additional barrier layer is a layer closest to a stacking structure comprising said scattering layer.

9. The conductive substrate according to claim 1, wherein the transparent electrode further comprises a thin layer for homogenizing surface electrical properties, which, in relation to the scattering layer, is located at a top of a multilayer stacking structure forming said electrode.

10. The conductive substrate according to claim 9, wherein the transparent electrode further comprises at least one additional insertion layer located between the metal conduction layer and the thin layer.

11. The conductive substrate according to claim 10, wherein:
a geometric thickness of the insertion layer ($E_{in}$) is such that its ohmic thickness is at most equal to $10^{12}$ ohm, wherein the ohmic thickness is equal to a ratio between a resistivity of a material forming the insertion layer ($\square$), and a geometric thickness of this same layer (l); and
the geometric thickness of the insertion layer is linked to a geometric thickness of a first organic layer of an organic light-emitting device comprising the conductive substrate ($E_{org}$), wherein the term "first organic layer" denotes all organic layers disposed between the insertion layer and the organic light-emitting layer, by the equation: $E_{org} = A - E_{in}$, where A is a constant having a value in the range of 5.0 to 75.0 nm.

12. The conductive substrate according to claim 10, wherein:
a geometric thickness of the insertion layer ($E_{in}$) is such that its ohmic thickness is at most equal to $10^{12}$ ohm, wherein the ohmic thickness is equal to a ratio between resistivity of a material forming the insertion layer ($\square$) and a geometric thickness of this same layer (l); and
the geometric thickness of the insertion layer is linked to a geometric thickness of a first organic layer of an organic light-emitting device comprising the conductive substrate ($E_{org}$), wherein the term "first organic layer" denotes all organic layers disposed between the insertion layer and the organic light-emitting layer, by the equation: $E_{org} = C - E_{in}$, where C is a constant having a value in the range of 150.0 to 250.0 nm.

13. The conductive substrate according to claim 1, wherein the metal conduction layer comprises at least one sacrificial layer on at least one of its faces.

14. The conductive substrate according to claim 1, wherein a stacking structure comprising the transparent support and the scattering layer on which the transparent electrode is deposited, comprises at least one functional coating on a face opposite the face on which the scattering layer is deposited.

15. An organic light-emitting device comprising at least one translucent conductive substrate according to claim 1.

16. The light-emitting device according to claim 15 that emits quasi-white light.

17. A method for manufacturing the translucent conductive substrate according to claim 1, the method comprising:
depositing the scattering layer on the transparent support;
depositing the coating having properties for improving light transmission on the scattering layer; and
depositing the metal conduction layer on the coating, directly followed by deposition of at least one different functional element.

18. A method for manufacturing the translucent conductive substrate according to claim 9, the method comprising:
depositing the scattering layer on the transparent support;
depositing the coating having properties for improving light transmission through the electrode, the metal conduction layer, a sacrificial layer, and an insertion layer on the scattering layer; and
depositing the thin homogenisation layer directly followed by deposition of at least one different functional element.

19. A translucent conductive substrate, comprising:
a transparent support;
a scattering layer formed over the transparent support and comprising a glass comprising a base material having a first refractive index for at least one wavelength of light to be transmitted and a plurality of scattering materials dispersed in the base material and having a second refractive index different from the first refractive index; and
a transparent electrode formed over the scattering layer, said electrode comprising at least one metal conduction layer and at least one coating having properties for improving light transmission through said electrode, such that said coating comprises at least one layer for improving light transmission and is located between the metal conduction layer and the scattering layer,
wherein the at least one coating having properties for improving light transmission has a geometric thickness at least more than 3.0 nm and at most less than or equal to 200 nm;
wherein the geometric thickness of the coating having properties for improving light transmission, $T_{D1}$, and a geometric thickness of the metal conduction layer, $T_{ME}$, are linked by the equation:

$$T_{ME} = T_{ME\_0} + [B * \sin(\pi * T_{D1}/T_{D1\_0})]/(n_{ss})^3$$

where $T_{ME\_0}$, B and $T_{D1\_0}$ are constants with $T_{ME\_0}$ having a value in the range of 10.0 to 25.0 nm, B having a value in the range of 10.0 to 16.5 nm and $T_{D1\_0}$ having a value in the range of $23.9 * n_{D1}$ to $28.3 * n_{D1}$ nm, with $n_{D1}$ representing the refractive index of the coating for improving the light transmission at a wavelength of 550 nm and $n_{ss}$ represents the refractive index of a stacking structure comprising the support and the scattering layer at a wavelength of 550 nm, where:

$$n_{ss} = \frac{(n_{support} * l_{support}) + (n_{scatteringlayer} * l_{scatteringlayer})}{(l_{support} + l_{scatteringlayer})}$$

$n_{support}$ representing the refractive index of transparent support at a wavelength of 550 nm, $n_{scatteringlayer}$ representing the refractive index of the scattering layer at a wavelength of 550 nm, $l_{support}$ representing the geometrical thickness of the support and $l_{scatteringlayer}$ representing the geometrical thickness of the scattering layer.

* * * * *